US006903626B2

(12) United States Patent
Tsutsumi et al.

(10) Patent No.: US 6,903,626 B2
(45) Date of Patent: Jun. 7, 2005

(54) SURFACE ACOUSTIC WAVE ELEMENT AND DUPLEXER HAVING THE SAME

(75) Inventors: Jun Tsutsumi, Kawasaki (JP); Masahiko Imai, Kawasaki (JP); Shogo Inoue, Kawasaki (JP); Takashi Matsuda, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 10 days.

(21) Appl. No.: 10/315,945

(22) Filed: Dec. 11, 2002

(65) Prior Publication Data

US 2003/0117039 A1 Jun. 26, 2003

(30) Foreign Application Priority Data

Dec. 14, 2001 (JP) .......................... 2001-382058

(51) Int. Cl.[7] .............................. H03H 9/72; H03H 9/64
(52) U.S. Cl. ..................... 333/133; 333/193; 333/195
(58) Field of Search ................. 333/193–196, 333/133

(56) References Cited

U.S. PATENT DOCUMENTS 6,137,380 A * 10/2000 Ushiroku et al. ........... 333/193
6,208,224 B1 * 3/2001 Taniguchi et al. .......... 333/193
6,326,864 B1 * 12/2001 Takamine et al. .......... 333/133
6,480,075 B1 * 11/2002 Fujita et al. ................ 333/193
6,570,470 B2 * 5/2003 Maehara et al. ............ 333/193

FOREIGN PATENT DOCUMENTS

| JP | 4-288718 | 10/1992 |
| JP | 5-90268 | 4/1993 |
| JP | 9-55640 | 2/1997 |
| JP | 9-93072 | 4/1997 |
| JP | 9-121136 | 5/1997 |
| JP | 10-303698 | 11/1998 |
| JP | 11-191720 | 7/1999 |
| JP | 2001-510950 | 8/2001 |

* cited by examiner

Primary Examiner—Barbara Summons
(74) Attorney, Agent, or Firm—Arent Fox

(57) ABSTRACT

A surface acoustic wave element includes surface acoustic wave (SAW) resonators arranged in a ladder formation on a piezoelectric substrate. A resonance frequency $f_{S1}$ of a series-arm resonator of a first stage viewed from an input side of the surface acoustic wave element and an average resonance frequency $f_{Sav}$ of all of remaining series-arm SAW resonators satisfy $1.00 f_{Sav} > f_{S1} \geq 0.99 f_{Sav}$.

10 Claims, 13 Drawing Sheets

RATIO OF CHANGE IN ELECTRODE FINGER PERIOD OF P1 [%]

AMOUNT OF CHANGE IN ELECTRODE FINGER PERIOD

AMOUNT OF CHANGE IN ELECTRODE FINGER PERIOD OF S1

AMOUNT OF CHANGE IN ELECTRODE FINGER PERIOD OF S1

SURFACE ACOUSTIC WAVE ELEMENT AND DUPLEXER HAVING THE SAME

CROSS-REFERENCE TO RELATED APPLICATIONS

This application is based on, and claims priority to, Japanese Application No. 2001-382058, filed on Dec. 14, 2001, in Japan, and which is incorporated herein by reference.

BACKGROUND OF THE INVENTION

1. Field of the Invention

The present invention generally relates to surface acoustic wave elements, and more particularly, to a surface acoustic wave element that may be suitably used as a filter in a radio frequency section of mobile communication devices, in which such a filter is required to have advanced filter band-pass characteristics, particularly, higher breakdown power and an improved shape factor of the pass band. Further, the present invention is concerned with a duplexer using the above surface acoustic wave element.

2. Description of the Related Art

The surface acoustic wave element (SAW element), which is typically used as a SAW filter, has widely been applied to mobile communication devices such as cellular phones. Particularly, in recent years, there has been considerable activity in the development of replacement of a dielectric type antenna duplexer for separating transmitting and received signals from each other with the SAW element for the purpose of downsizing and reduction in the thickness of the mobile communication devices. It is essential to improve the breakdown power and the shape factor of the pass band of the SAW element in order to develop the antenna duplexer with the SAW technique. The reasons for such improvement are as follows. First, the antenna duplexer is placed just before the antenna, and amplified high power passes through the duplexer. If the SAW element does not have a sufficient breakdown power, it may be destroyed. Second, the recent mobile communication systems employ the transmit band and the receive band that are very close to each other. In order to prevent cross talk from developing between the transmit band and the receive band, the respective pass bands have sharp falling/rising edges. As described above, in order to achieve the antenna duplexer with the SAW technique, it is essential to improve the breakdown power and the shape factor of the pass bands of the SAW element.

There are two ways of improving the breakdown power of the SAW element. The first way is to improve the substance of the interdigital transducer that excites the SAW. The second way is to improve the design of the electrodes including the interdigital transducers. The first way is disclosed in, for example, Japanese Unexamined Patent Publication Nos. 5-90268 and 4-288718.

The second way is disclosed in, for example, Japanese Unexamined Patent Application No. 10-303698, in which the interdigital transducers respectively forming resonators of a ladder type SAW filter have slightly different electrode finger periods. Particularly, a unique arrangement for improvement in the breakdown power is proposed. According to the proposed arrangement, the electrode finger period of the series-arm resonator located at the first stage viewed from the input side is smaller than that of another series-arm resonator, while the electrode finger period of the parallel-arm resonator located at the first stage viewed from the input side is larger than that of another parallel-arm resonator. The above-mentioned publication reports that the above-mentioned settings of the electrode fingers enable the resonance frequency at which the breakdown power becomes the weakest to shift to the outside of the pass band. More specifically, according to the publication, the resonance frequency of the series-arm resonator at the first stage is set higher by reducing the electrode finger period thereof, and the resonance frequency of the parallel-arm resonator at the first stage is set lower by enlarging the electrode finger period thereof. The above-mentioned arrangement disclosed in the publication greatly improves the breakdown power of the SAW filter and enables practical antenna duplexers that have pass bands in the range of 800 MHz to 1 GHz.

The recent mobile communication systems employ a pass band in the range of 1.8 GHz to 2 GHz, which is higher than the conventional pass band frequencies. Such higher pass band frequencies require further improved pass band shape. That is, the SAW filters used for the higher-frequency band would not be achieved unless both the breakdown power and pass-band shape are simultaneously improved. Shifting the pass band towards higher frequencies needs improvement in the breakdown power of the SAW filter. It is to be noted that the frequencies of the pass band are inversely proportional to the electrode finger period of the interdigital transducer. That is, the higher the pass band frequency, the shorter the finger period. As a result, each finger becomes narrower, which degrades the breakdown power characteristic.

Conventionally, it is very difficult to simultaneously improve both the breakdown power and pass band shape of the ladder-type SAW filter. This is because the breakdown power of the ladder-type SAW filter depends on the frequency. It is known that the frequency at which the breakdown power becomes the weakest is located in between the pass band and the rejection range, as disclosed in FIG. 3 of Japanese Unexamined Patent Publication No. 10-303698. If the shape of the filter pass band is improved so as to have sharper rising/falling edges, the pass band and the rejection range will become closer to each other, so that the frequency for the weakest breakdown power becomes very close to the pass band. In this case, the breakdown power is greatly lower than that of the SAW filter that does not have a good band shape.

SUMMARY OF THE INVENTION

It is an object of the present invention to simultaneously improve the breakdown power and the pass-band shape of the SAW element.

A more specific object of the present invention is to provide a SAW element that has improved breakdown power and pass-band shape based on unique principles different from the conventional mechanism.

According to a first aspect of the present invention, there is provided a surface acoustic wave element comprising surface acoustic wave (SAW) resonators arranged in a ladder formation on a piezoelectric substrate, a resonance frequency $f_{S1}$ of a series-arm resonator of a first stage viewed from an input side of the surface acoustic wave element and an average resonance frequency $f_{Sav}$ of all of remaining series-arm SAW resonators satisfying $1.00 f_{Sav} > f_{S1} \geq 0.99 f_{Sav}$. The inventors found out that the above condition reduces power consumption at the higher-frequency side band-edge and improves the breakdown power. This means that the breakdown power can be improved by changing the resonance frequency of the series-arm resonator of the first stage towards lower frequencies within the specified pass band. This principle of the invention is different from the prior art that raises the resonance frequency of the series-arm resonator of the first stage to thereby cause the resonance frequency to go beyond the specified pass band for improvement in the breakdown power.

According to a second aspect of the present invention, there is provided a surface acoustic wave element comprising surface acoustic wave (SAW) resonators arranged in a ladder formation on a piezoelectric substrate, ratios (electrode finger width)/(electrode finger period) in interdigital transducers of series-arm resonators are substantially equal to each other, an electrode finger period $\lambda_{S1}$ of the series-arm resonator of a first stage viewed from an input side of the surface acoustic wave element and an average electrode finger period $\lambda_{Sav}$ of all the remaining series-arm SAW resonators satisfying $1.01\lambda_{Sav} \geq \lambda_{S1} > 1.00\lambda_{Sav}$. The inventors found out that the above condition reduces power consumption at the higher-frequency side band-edge and improves the breakdown power. This means that the breakdown power can be improved by changing the resonance frequency of the series-arm resonator of the first stage towards lower frequencies within the specified pass band. This principle of the invention is different from the prior art that raises the resonance frequency of the series-arm resonator of the first stage to thereby cause the resonance frequency to go beyond the specified pass band for improvement in the breakdown power.

According to a third aspect of the present invention, there is provided a surface acoustic wave element comprising surface acoustic wave (SAW) resonators arranged in a ladder formation on a piezoelectric substrate, a resonance frequency $f_{P1}$ of a parallel-arm resonator of a first stage viewed from an input side of the surface acoustic wave element and an average resonance frequency $f_{Pav}$ of all of remaining parallel-arm SAW resonators satisfying $1.01f_{Pav} \geq f_{P1} > 1.00f_{Pav}$. The inventors found out that the above condition reduces power consumption at the lower-frequency side band-edge and improves the breakdown power. This means that the breakdown power can be improved by changing the resonance frequency of the parallel-arm resonator of the first stage towards higher frequencies within the specified pass band. This principle of the invention is different from the prior art that reduces the resonance frequency of the parallel-arm resonator of the first stage to thereby cause the resonance frequency to go beyond the specified pass band for improvement in the breakdown power.

According to a fourth aspect of the present invention, there is provided a surface acoustic wave element comprising surface acoustic wave (SAW) resonators arranged in a ladder formation on a piezoelectric substrate, ratios (electrode finger width)/(electrode finger period) in interdigital transducers of parallel-arm resonators are substantially equal to each other, an electrode finger period $\lambda_{P1}$ of the parallel-arm resonator of a first stage viewed from an input side of the surface acoustic wave element and an average electrode finger period $\lambda_{Pav}$ of all the remaining parallel-arm SAW resonators satisfying $1.00\lambda_{Pav} > \lambda_{P1} \geq 0.99\lambda_{Pav}$. The inventors found out that the above condition reduces power consumption at the lower-frequency side band-edge and improves the breakdown power. This means that the breakdown power can be improved by changing the resonance frequency of the parallel-arm resonator of the first stage towards higher frequencies within the specified pass band. This principle of the invention is different from the prior art that reduces the resonance frequency of the parallel-arm resonator of the first stage to thereby cause the resonance frequency to go beyond the specified pass band for improvement in the breakdown power.

According to a fifth aspect of the invention, the SAW element according to the first or second aspect of the invention may be configured so that the interdigital transducer of at least one of the series-arm resonators has an electrode finger width that is equal to or larger than 7.5% of the electrode finger period of said at least one of the series-arm resonators and is smaller than 25% thereof. More preferably, the interdigital transducer of at least one of the series-arm resonators has an electrode finger width that is equal to or larger than 15% of the electrode finger period of said at least one of the series-arm resonators and is smaller than 22.5% thereof.

According to a sixth aspect of the present invention, the interdigital transducer of at least one of the series-arm resonators has finger non-overlapping portions having a length equal to 1.0–4.5 times the electrode finger period, and dummy electrodes that are not involved in excitation of SAW are provided in the non-overlapping portions.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

(First Embodiment)

A first embodiment of the present invention is an embodiment of the aforementioned first and second aspects of the invention. The first and second aspects of the invention are able to improve the breakdown power. In order to facilitate better understanding the first and second aspects of the invention, a description will first be given of the frequency dependence of the breakdown power of a ladder type SAW filter made up of SAW resonators formed on a piezoelectric substrate or chip arranged in a series arm and a parallel arm. The ladder type SAW filter is a typical version of the SAW element.

Figure 3:
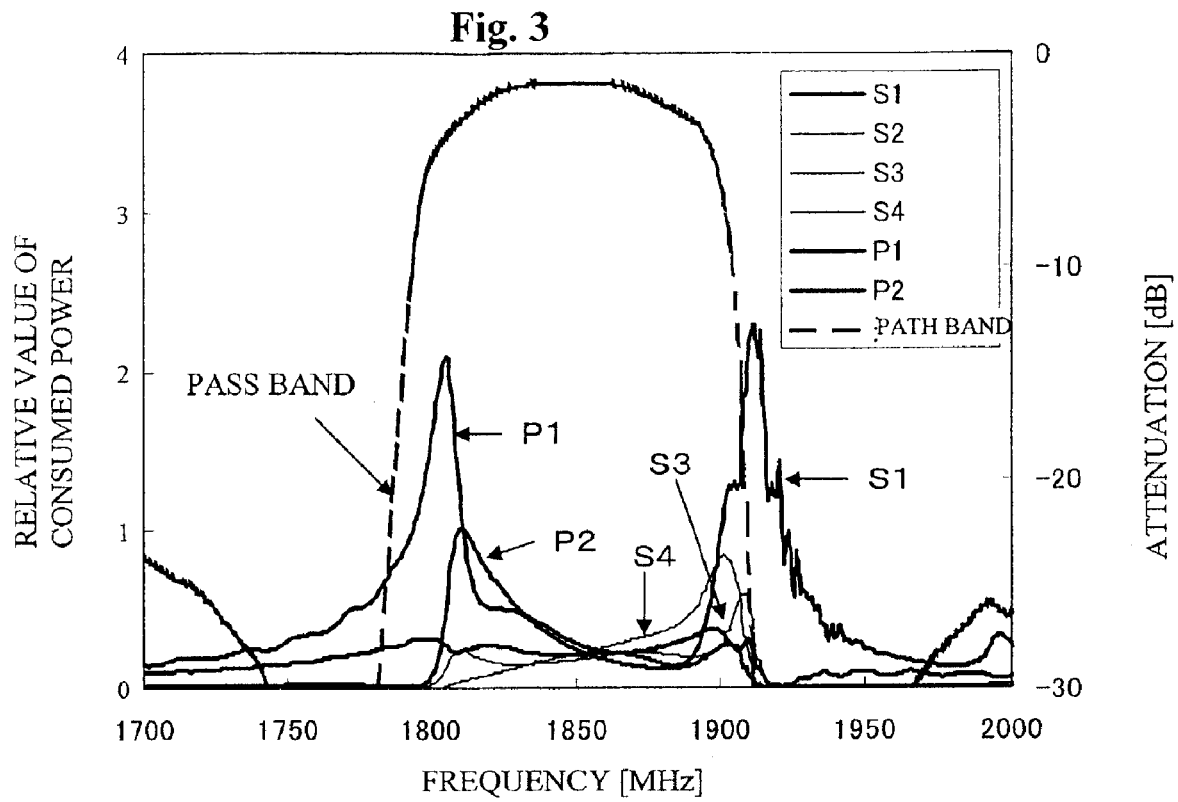
FIG. 3 is a graph showing computational results of the power consumption and pass band characteristics.

As described in FIG. 3 of Japanese Unexamined Patent Publication No. 10-303698 mentioned before, it is known that power is applied to the ladder type SAW filter while changing the frequency, the temperature of the chip becomes the highest at an intermediate frequency between the pass band and the rejection band. In other words, the breakdown power of the ladder type SAW filter becomes the weakest at that frequency.

Figure 1A:
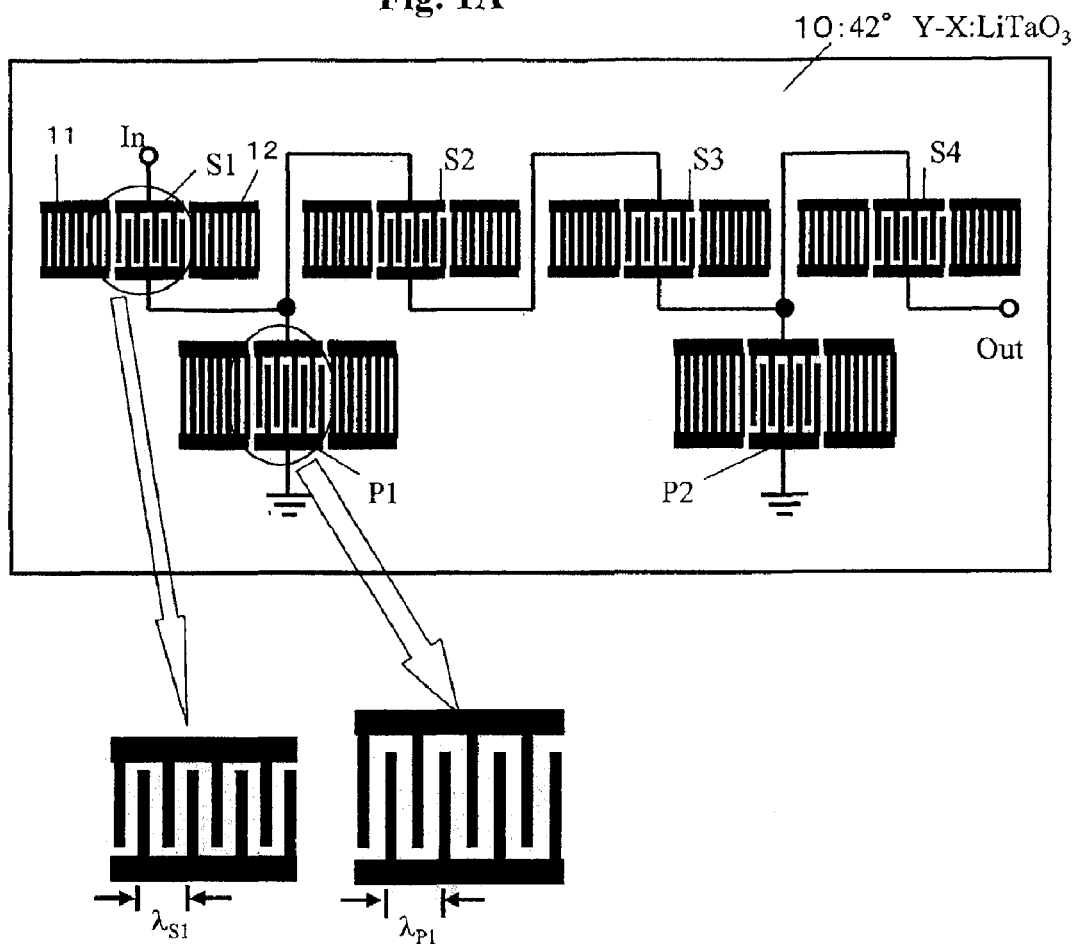
FIG. 1A illustrates a structure of a SAW element according to an embodiment of the present invention.

The above experimental fact will be validated by computer simulation. FIG. 1A illustrates the structure of a SAW element or device used in the simulation. The SAW filter of FIG. 1A is a ladder-type filter of a four-stage structure composed of four series-arm resonators S1–S4 and two parallel-arm resonators P1 and P2, these resonators being formed on a LiTaO$_3$ 42° Y-cut X-propagation substrate 10. Each of the resonators is a one-port SAW resonator. Each resonator has an interdigital transducer S1–S4, P1 or P2 (which symbols are the same as those used to indicate the resonators for the sake of simplicity), and two reflectors 11 and 12 arranged at both sides of the interdigital transducer. As enlarged in FIG. 1A, the electrode finger period of each of the series-arm resonators S1–S4 is denoted as $\lambda_{S1}$, and the electrode finger period of each of the parallel-arm resonators P1 and P2 is denoted as $\lambda_{P1}$.

Figure 2A:
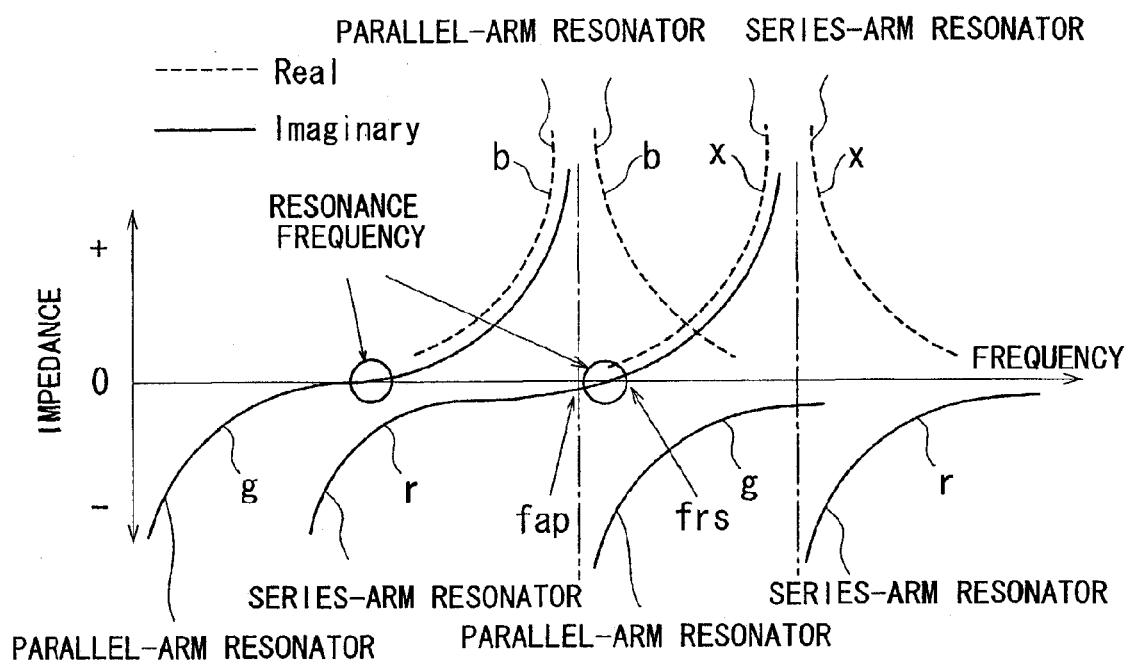
FIG. 2A is a graph showing variation in impedance of a SAW resonator as a function of frequency.
Figure 2B:
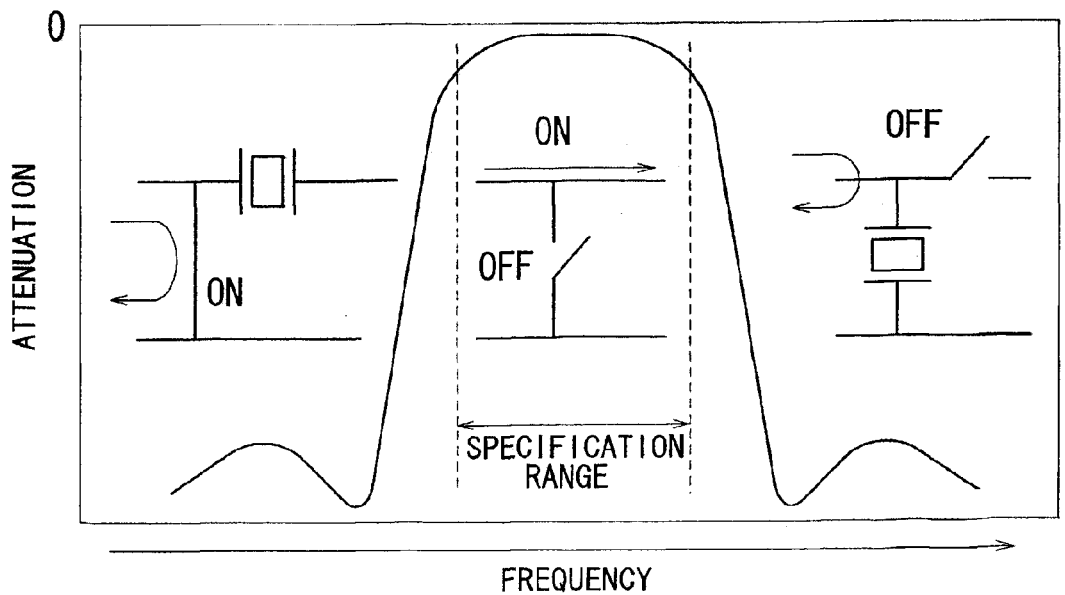
FIG. 2B is a graph showing variation in attenuation of the SAW resonator as a function of frequency.

FIGS. 2A and 2B show a relationship between the frequency characteristic and the amount of attenuation of the SAW resonator. More particularly, FIG. 2A shows a frequency characteristic of the impedance of the series-arm resonator (such as S1) and that of the admittance of the parallel-arm resonator (such as P1). The impedance of the series-arm resonator is represented as $Zs=r+jx$ where $Zs$ is the impedance of the series-arm resonator, r is the resistance component, and x is the reactance component. The admittance of the parallel-arm resonator is represented as $Yp=g+jb$ where $Yp$ is the admittance of the parallel-arm resonator, g is the conductance component, and b is the susceptance component. The vertical axis of the graph denotes the impedance or admittance, and the horizontal axis thereof denotes the frequency. The positions on the horizontal axis where the reactance x or susceptance b is zero correspond to the resonant frequencies of the series-arm and parallel-arm resonators. It can be seen from FIG. 2A that the resonance frequency of the series-arm resonator is approximately equal to the anti-resonance frequency of the parallel-arm resonator.

FIG. 2B shows a filter characteristic of the SAW element illustrated so as to coincide with the frequency characteristic shown in FIG. 2A. The pass band includes the resonance frequency of the series-arm resonator and the impedance $Zs$ is approximately zero. This causes the most current to flow through the series-arm resonator. The admittance of the parallel-arm resonator may not be zero close to the resonance frequency of the series-arm resonator. This may result in slight current flowing through the parallel-arm resonator.

It can be said from the above description that the SAW filter shown in FIG. 1A is a ladder-type SAW element that has one-port SAW resonators (P1, P2) that are arranged in parallel arms and one-port SAW resonators (S1–S4) that are arranged in the series arms and have the resonance frequencies approximately equal to the anti-resonance frequencies of the parallel-arm resonators, wherein each of the resonators (S1–S4, P1, P2) has comb-type electrodes (interdigital transducer) having a respective number of electrode fingers.

The parameter values shown in Table 1 are given to the resonators that form the above-mentioned SAW filter, and power consumed therein is then computed.

TABLE 1

|  |  | Electrode Finger Period [μm] | Electrode Finger Crossing Width [μm] | Number of Finger Pairs | Electrode Finger Width/ Electrode Finger Period | Reflector Finger Period [μm] | Number of Fingers of Reflector |
|---|---|---|---|---|---|---|---|
| Series Arm | S1 | 2.09 | 35 | 160 | 0.25 | 1.045 | 120 |
|  | S2 | 2.09 | 35 | 160 | 0.25 | 1.045 | 120 |
|  | S3 | 2.09 | 35 | 160 | 0.25 | 1.045 | 120 |
|  | S4 | 2.09 | 35 | 120 | 0.25 | 1.045 | 120 |
| Parallel Arm | P1 | 2.16 | 60 | 90 | 0.25 | 1.08 | 120 |
|  | P2 | 2.16 | 60 | 90 | 0.25 | 1.08 | 120 |

Figure 1B:
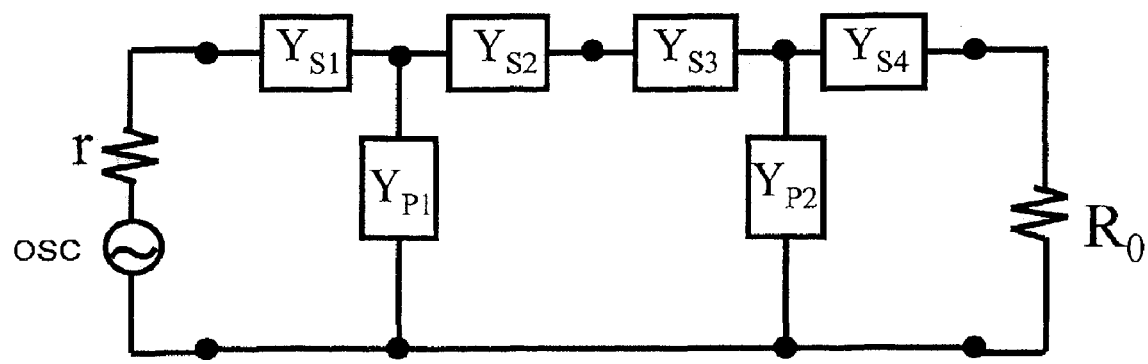
FIG. 1B illustrates an equivalent circuit of the SAW element shown in FIG. 1A.

Here, the arrangement shown in FIG. 1A is converted into an equivalent circuit shown in FIG. 1B wherein the resonators are respective admittance elements ($Y_{S1}$, $Y_{S2}$, $Y_{S3}$, $Y_{S4}$, $Y_{P1}$, $Y_{P2}$) and an ac power source OSC having an inner resistance r of 50 Ω is connected to the input terminal of the SAW filter, while a load Ro of 50 Ω is connected to the output terminal thereof. Then, the equivalent circuit is computed to obtain currents and voltages in all the resonators and to obtain power consumption.

The results of computation of power consumption and pass-band characteristic are shown in FIG. 3. As to the series-arm resonators S1–S4, there are peaks of power consumption in transient sections on the high-frequency side of the pass band (curve S2 overlaps with curve S3). As to the parallel-arm resonators P1 and P2, there are peaks of power consumption in transient sections on the low-frequency side of the pass band. It should be noted that the more the power consumption, the lower the breakdown power. The above-mentioned computation results show that a large amount of power is consumed in the transient sections and the breakdown power characteristic is degraded therein. Further, as far as the series-arm resonators are concerned, the resonator S1 closest to the input side has the greatest peak. Similarly, as far as the parallel-arm resonators are concerned, the resonator P1 closest to the input side has the greatest peak. This shows that the resonators closest to the input side of the SAW filter have comparatively low breakdown powers. This conclusion obtained from the computation coincides with the experimental results very well. Based on the above-mentioned consideration, the inventors studied appropriate ways of improving the breakdown power in the equivalent circuit shown in FIG. 1B.

Figure 4:
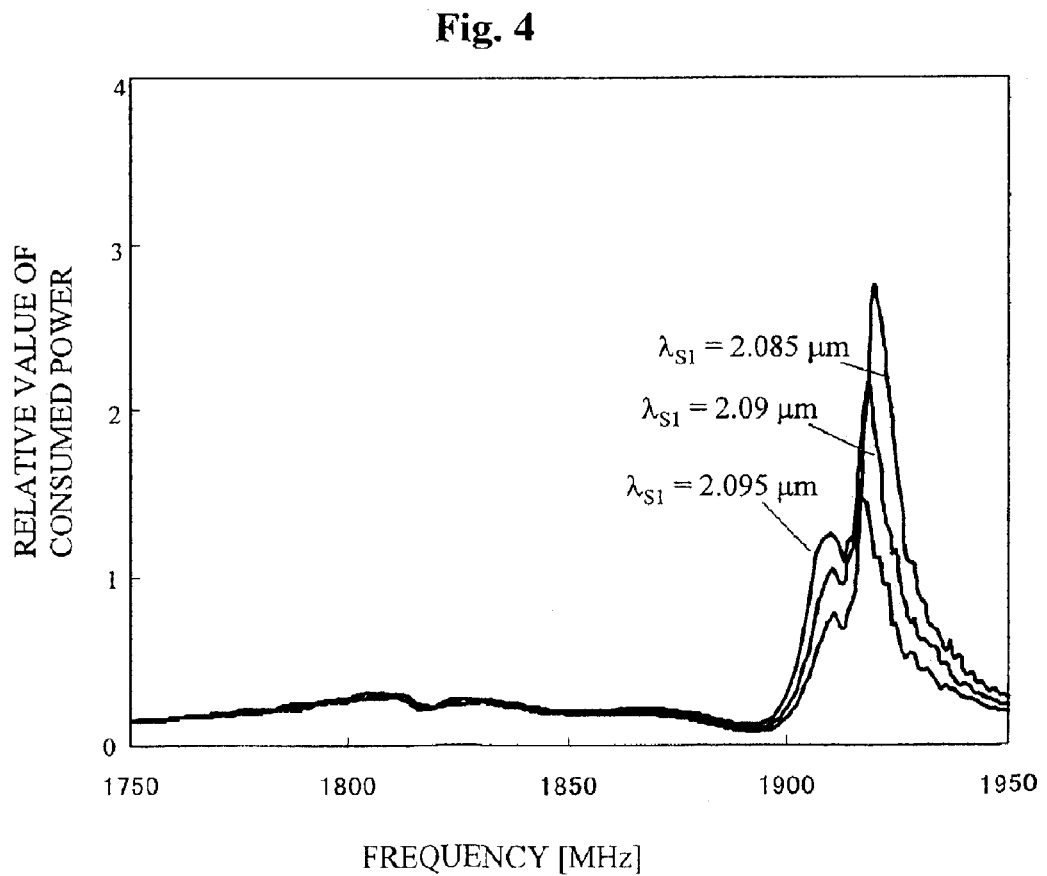
FIG. 4 is a graph showing variation in power consumed in the series-arm resonator of the first stage closest to the input side of the SAW filter observed by changing only the electrode finger period $\lambda_{S1}$ of that resonator.
Figure 5:
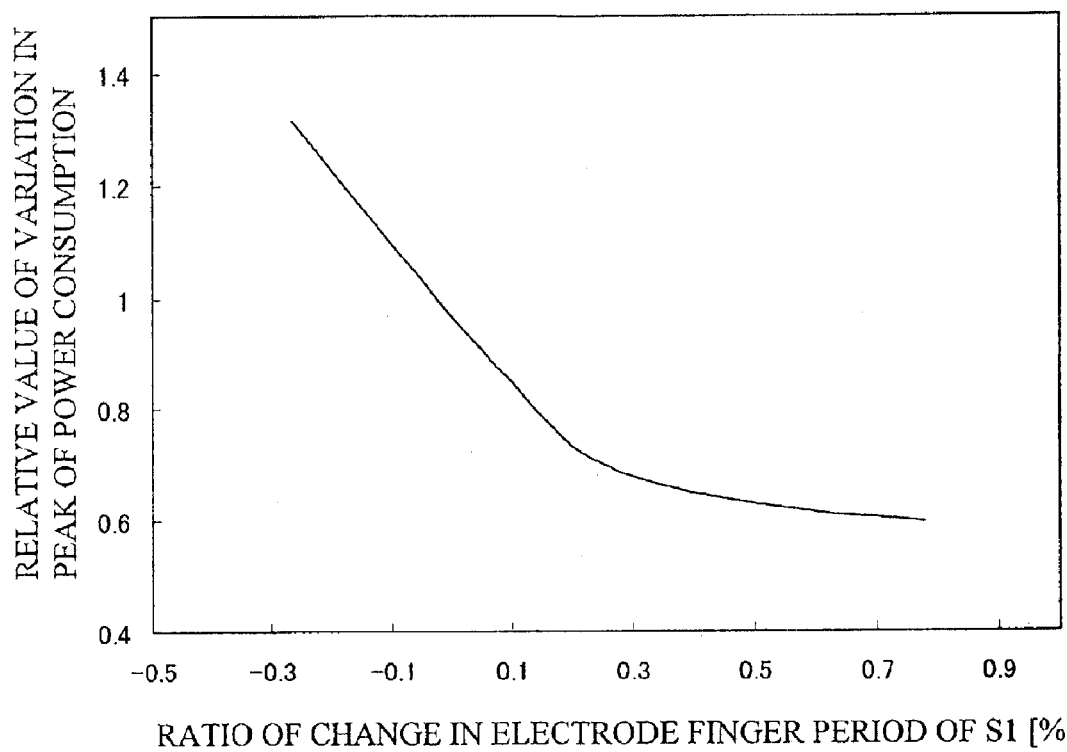
FIG. 5 is a graph showing variation in the peak intensity of power consumption as a function of a ratio of change in the electrode finger period of the series-arm resonator S1 of the first stage.

It can be seen from the above-mentioned computational results that the breakdown power of the SAW filter can be improved by reducing power consumed in the resonators closest to the input terminal. First, the series-arm resonator is described. In the ladder-type SAW filter structure shown in FIG. 1A, variation in power consumption of the series-arm resonator S1 of the first stage obtained when only the electrode finger period $\lambda_{S1}$ of the resonator S1 is changed is shown in FIG. 4. In this case, the electrode finger periods $\lambda_{S2}$, $\lambda_{S3}$, and $\lambda_{S4}$ of all the other series-arm resonators S2, S3 and S4 are not changed. FIG. 4 shows that the peak intensity of the power consumption is reduced by increasing the electrode finger period of the series-arm resonator S1 of the first stage by 0.005 μm so that the resultant period $\lambda_{S1}$ becomes equal to 2.095 μm. FIG. 5 shows variation in the peak intensity of power consumption (described by a relative value) with respect to the ratio of change of the electrode finger period $\lambda_{S1}$ of the series-arm resonator S1. When the ratio of change is "0" (there is no change in $\lambda_{S1}$), the relative value of the variation in the peak intensity of power consumption is "1". It can be seen from FIGS. 4 and 5 that the peak intensity of the series-arm resonator S1 of the first stage can be reduced so that the breakdown power can be improved by making the electrode finger period $\lambda_{S1}$ of the resonator S1 of the first stage longer than the electrode finger periods $\lambda_{S2}$, $\lambda_{S3}$, and $\lambda_{S4}$ of all the remaining series-arm resonators S2, S3 and S4. In contrast, it is supposed that the peak intensity of power consumption may become greater and the breakdown power may be degraded by comparatively shortening the electrode finger period $\lambda_{S1}$ of the resonator S1.

The amount of change in the electrode finger period is now described. FIG. 5 shows that the peak intensity of the series-arm resonator S1 of the first stage can be reduced by setting the electrode finger period $\lambda_{S1}$ to a value longer than the average electrode finger period $\lambda_{Sav}$ (=$\lambda_{S2}$, $\lambda_{S3}$, $\lambda_{S4}$ in the example being considered), even slightly. The peak intensity is simply reduced by increasing the ratio of change in the electrode finger period $\lambda_{S1}$ up to 0.7%. When the ratio of change in the period $\lambda_{S1}$ is greater than 0.7%, the peak intensity is not reduced substantially and fixed improvement in breakdown power can be obtained. This shows that the upper limit of the ratio of change cannot be defined by the breakdown power. The ratio of change in the period $\lambda_{S1}$ may be limited by the influence to the pass band characteristic. When the relative value of variation in the peak of power consumption is equal to or smaller than 1%, the filter pass band characteristic is not affected greatly. Consequently, it is preferable that the electrode finger period $\lambda_{S1}$ meets $1.01\lambda_{Sav} \geq \lambda_{S1} > 1.00\lambda_{Sav}$.

Next, variation in the resonance frequency caused by changing the electrode finger period is now described. Generally, the following equation stands:

$$f = v/\lambda \quad (1)$$

where f is the resonance frequency of the SAW resonator, λ is the electrode finger period, and v is the velocity of SAW. That is, the frequency is inversely proportional to the electrode finger period. The condition $1.01\lambda_{Sav} \geq \lambda_{S1} > 1.00\lambda_{Sav}$ for the series-arm resonator S1 can thus be rewritten into $1.00f_{Sav} > f_{S1} \geq 0.99f_{Sav}$ where $f_{S1}$ is the resonance frequency of the series-arm resonator S1, and $f_{Sav}$ is the average of the resonance frequencies $f_{S2}$, $f_{S3}$ and $f_{S4}$ of all the remaining series-arm resonators S2, S3 and S4. The breakdown power can be improved by selecting the resonance frequency $f_{S1}$ of the resonator S1 of the first stage within the range of $1.00f_{Sav} > f_{S1} \geq 0.99f_{Sav}$.

It is possible to improve the breakdown power by changing the resonance frequency of the series-arm resonator of the first stage towards the lower frequency in the pass band. This operational principle is different from that of the conventional art wherein the resonance frequency of the series-arm resonator of the first stage is made higher so as to shift to the outside of the pass band for improvement in the breakdown power.

Next, the possible way of changing the resonance frequency other than changing the electrode finger period will be considered. It can be seen from equation (1) that the resonance frequency may be changed by varying not only the electrode finger period but also the velocity of SAW. It is known that the SAW velocity depends on the value of the ratio (electrode finger width)/(electrode finger period). Based on these facts, the second aspect of the invention employs the series-arm resonators equipped with the respective interdigital transducers having an exactly equal or nearly equal (namely, substantially equal) value of the ratio (electrode finger width)/(electrode finger period), so that all the series-arm resonators have the equal or substantially equal SAW velocity and the breakdown power can be improved by changing only the electrode finger period. Alternatively, the resonance frequency may be changed by changing only the SAW velocity or both the SAW velocity and the electrode finger period. As long as the resonance frequency of the series-arm resonator of the first stage falls with the range defined in the first aspect of the invention, the breakdown power can be improved.

For example, the value of the ratio (electrode finger width)/(electrode finger period) in the interdigital transducer of the series-arm resonator S1 of the first stage connected in series to the signal input terminal of the SAW filter is made greater than the values of the ratios (electrode finger width)/(electrode finger period) in the interdigital transducers of all the remaining series-arm resonators S2–S4. Thus, the resonance frequency may be adjusted by using the effects resulting from change in the SAW velocity. In this case, all the series-arm resonators S1–S4 may have the same electrode finger period. Further, the breakdown power can be improved because the interdigital transducer of the series-arm resonator S1 of the first stage has a wider electrode finger width.

As another example, the breakdown power may be improved by reducing the resonance frequency of the series-arm resonator of the first stage viewed from the input side by making the electrode finger period of the interdigital transducer of the series-arm resonator of the first stage greater than the average electrode finger period of all the remaining series-arm resonators. It is not required that all the series-arm resonators have exactly or almost (namely, substantially) the same values of the ratio (electrode finger width)/(electrode finger period) as the second aspect of the invention. The breakdown power can be improved within the resonance frequency range defined in the first aspect of the invention.

(Second Embodiment)

A description will now be given of a second embodiment of the present invention. This embodiment relates to the aforementioned third and fourth aspects of the invention, and is directed to improving the breakdown power of the parallel-arm resonator of the first stage viewed from the input side. Basically, the breakdown power of the parallel-arm resonator of the first stage is improved for the same reasons as those for improvement in the series-arm resonator of the first stage.

Figure 6:
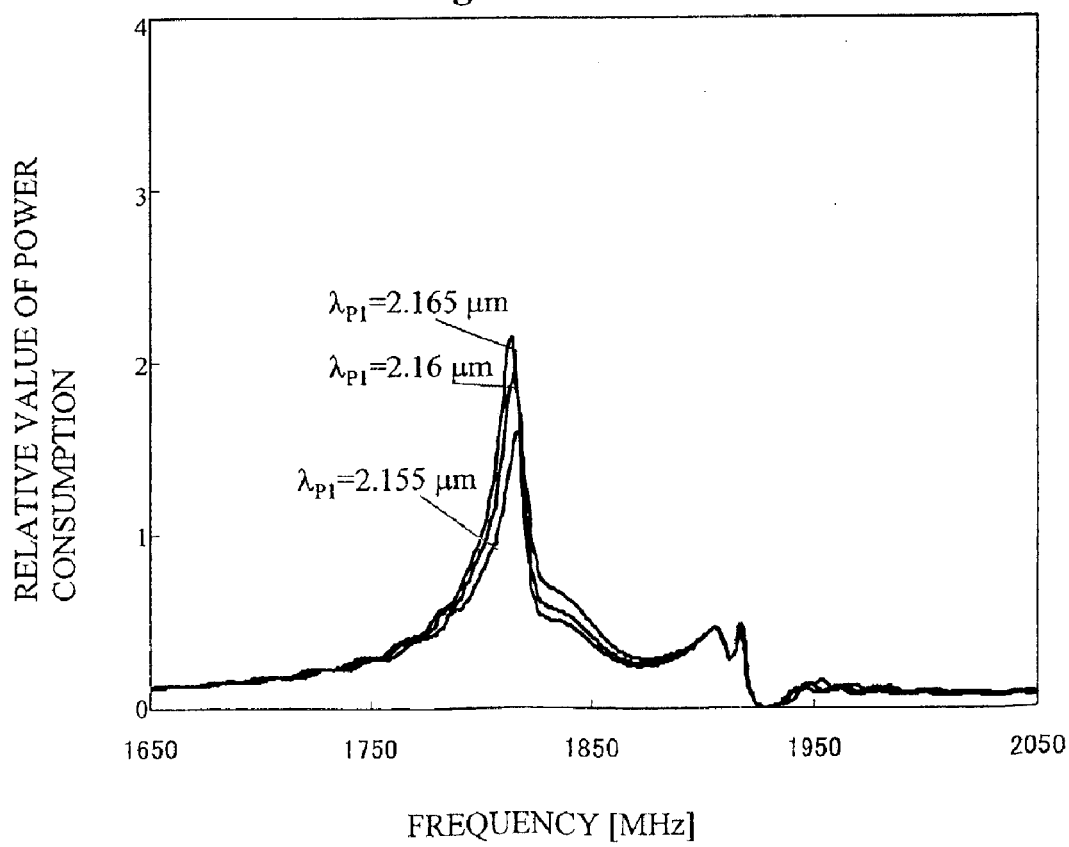
FIG. 6 is a graph showing variation in the peak intensity of power consumption observed by changing only the electrode finger period of the parallel-arm resonator P1 closes to the input side.
Figure 7:
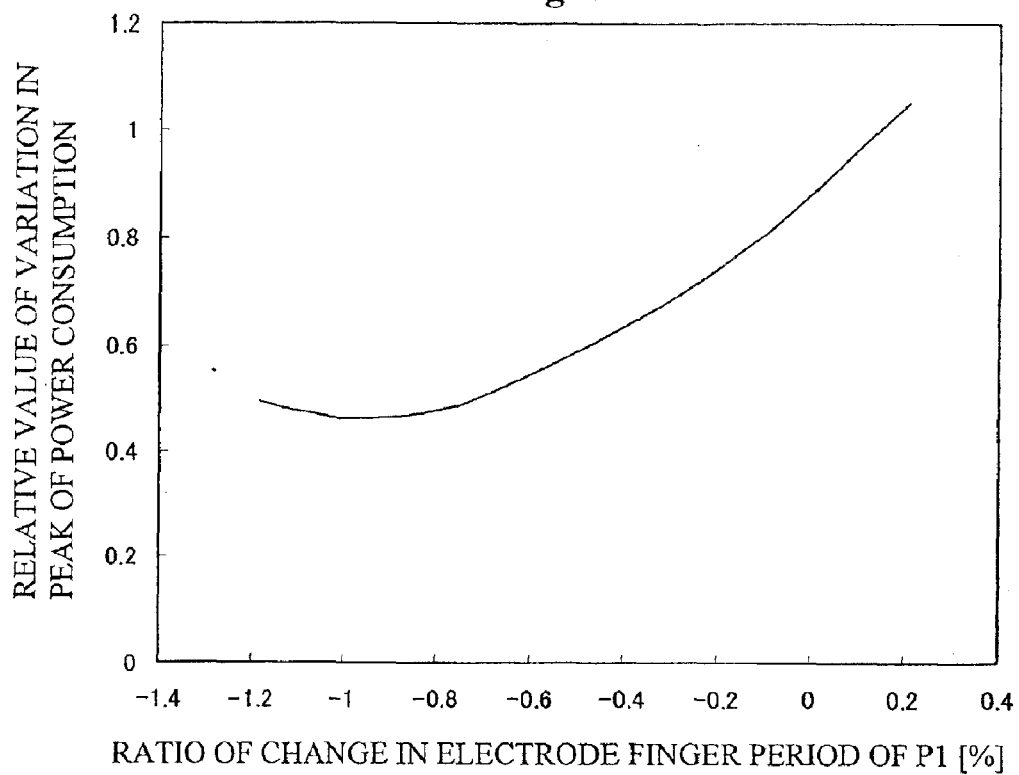
FIG. 7 is a graph showing variation in the peak intensity of power consumption as a function of a ratio of change in the electrode finger period of the parallel-arm resonator P1 of the first stage.

FIG. 6 shows variation in power consumed in the parallel-arm resonator P1 of the first stage obtained when only the electrode finger period $\lambda_{P1}$ of the parallel-arm resonator closest to the input terminal of the SAW filter is changed in the structure shown in FIGS. 1A and 1B. It can be seen from FIG. 6 that the peak of power consumption is reduced by shortening the electrode finger period $\lambda_{P1}$ of the parallel-arm resonator P1 of the first stage. FIG. 7 shows variation in the peak intensity (indicated as the relative value with respect to "1") as a function of the ratio of change in the electrode finger period $\lambda_{P1}$ of the parallel-arm resonator P1 of the first stage to the reference "0" at which the relative value of the variation in the peak intensity is "1". It can be seen from FIG. 7 that breakdown power can be improved by setting the electrode finger period $\lambda_{P1}$ of the parallel-arm resonator P1 of the first stage to a value shorter than those of the other parallel-arm resonator P2.

The amount of change in the electrode finger period is described. FIG. 7 shows that the peak intensity of the parallel-arm resonator P1 of the first stage can be reduced by setting the electrode finger period $\lambda_{P1}$ to a value shorter than the average electrode finger period $\lambda_{Pav}$ ($=\lambda_{P2}$ in the example being considered), even slightly. The peak intensity is simply reduced by reducing the electrode finger period $\lambda_{P1}$ to −1.0%. When the period $\lambda_{P1}$ exceeds −1.0%, the peak intensity is not reduced substantially and fixed improvement in breakdown power can be obtained. The upper limit of the ratio of change cannot be defined by the breakdown power. The ratio of change in the period $\lambda_{P1}$ may be limited by influence to the pass band characteristic. When the relative value of variation in the peak of power consumption is equal to or smaller than 1%, the filter pass band characteristic is not affected greatly. Consequently, it is preferable that the electrode finger period $\lambda_{P1}$ meets $1.00\lambda_{Pav} > \lambda_{P1} \geq 0.99\lambda_{Pav}$.

Next, variation in the resonance frequency by changing the electrode finger period is now described. Equation (1) can be used as in the case of the series-arm resonator. The condition $1.00\lambda_{Pav} > \lambda_{P1} \geq 0.99\lambda_{Pav}$ for the parallel-arm resonator P1 can thus be rewritten into $1.01f_{Pav} \geq f_{P1} > 1.00f_{Pav}$, where $f_{P1}$ is the resonance frequency of the parallel-arm resonator P1 of the first stage, and $f_{Pav}$ is the average of the resonance frequencies of all the remaining parallel-arm resonators (only the resonator P2 in the case being considered; thus $f_{Pav} = f_{P2}$). The breakdown power can be improved by selecting the resonance frequency $f_{P1}$ of the parallel-arm resonator P1 of the first stage within the range of $1.01f_{Pav} \geq f_{P1} > 1.00f_{Pav}$.

The resonance frequency of the parallel-arm resonator may be changed by changing the SAW velocity as in the case of the series-arm resonator. More particularly, the value of the ratio (electrode finger width)/(electrode finger period) in the interdigital transducer of the parallel-arm resonator of the first stage viewed from the input side of the SAW filter is made smaller than the average ratio (electrode finger width)/(electrode finger period) in the interdigital transducers of all the remaining parallel-arm resonators. Another way of improving the breakdown power is to raise the resonance frequency of the parallel-arm resonator of the first stage by setting the electrode finger period of the interdigital transducer of the first stage viewed from the input side to a value shorter than the average electrode finger period of the interdigital transducers of all the remaining parallel-arm resonators. In this case, it is not required that all the parallel-arm resonators P1, P2 have the equal value of the ratio (electrode finger width)/(electrode finger period). Improvement in the breakdown power may be achieved as long as the resonance frequency $f_{P1}$ meets the condition $1.01f_{Pav} \geq f_{P1} > 1.00f_{Pav}$.

As described above, the breakdown power can be improved by changing the resonance frequency of the parallel-arm resonator P1 of the first stage towards a higher frequency within the specified pass band. The above operational principle is different from that of the conventional art wherein the resonance frequency of the parallel-arm resonator of the first stage is made lower so as to shift to the outside of the specified pass band for improvement in the breakdown power.

(Third Embodiment)

A description will now be given of a third embodiment of the present invention. This embodiment relates to the aforementioned fifth aspect of the invention.

The third embodiment is a SAW element having an arrangement in which the electrode finger width of the interdigital transducer of at least one of the series-arm resonators in the first and second aspects of the invention is equal to or larger than 7.5% of the electrode finger period of the above-mentioned interdigital transducer and smaller than 25% thereof. This simultaneously improves both the breakdown power and the shape factor of the pass band. For instance, the first series-arm resonator S1 among the series-arm resonators S1–S4 is designed so that the value (electrode finger width)/(electrode finger period) is smaller than 0.25 at which the electrode finger width is equal to the electrode finger space. That is, the ratio (electrode finger width)/(electrode finger period) is equal to or greater than 7.5% and lower than 25%. This reduces the resonance frequency of the series-arm resonator S1 of the first stage, so that both the breakdown power and the shape factor can be improved simultaneously. The reason for improvement in the breakdown power has been described. Now, the reason for improvement in the shape factor will be described with experimental results.

When the space and width of the electrode fingers are equal to each other, the value (electrode finger width)/(electrode finger period) is 0.25. In contrast, the fifth aspect of the invention has a relatively narrow electrode finger width and a relatively large electrode finger space or gap. The experimental results by the inventors exhibit that the shape factor of the pass band can be improved with the finger width made narrower.

Figure 8:
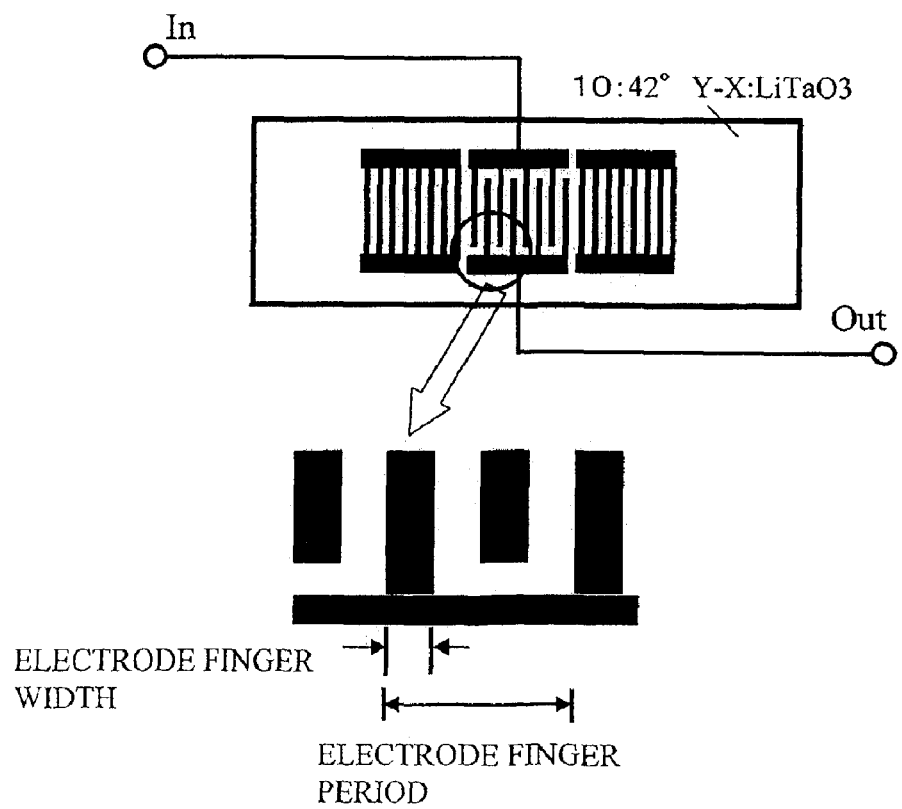
FIG. 8 illustrates the structure of a series-arm resonator used for validating the shape factor.
Figure 9:
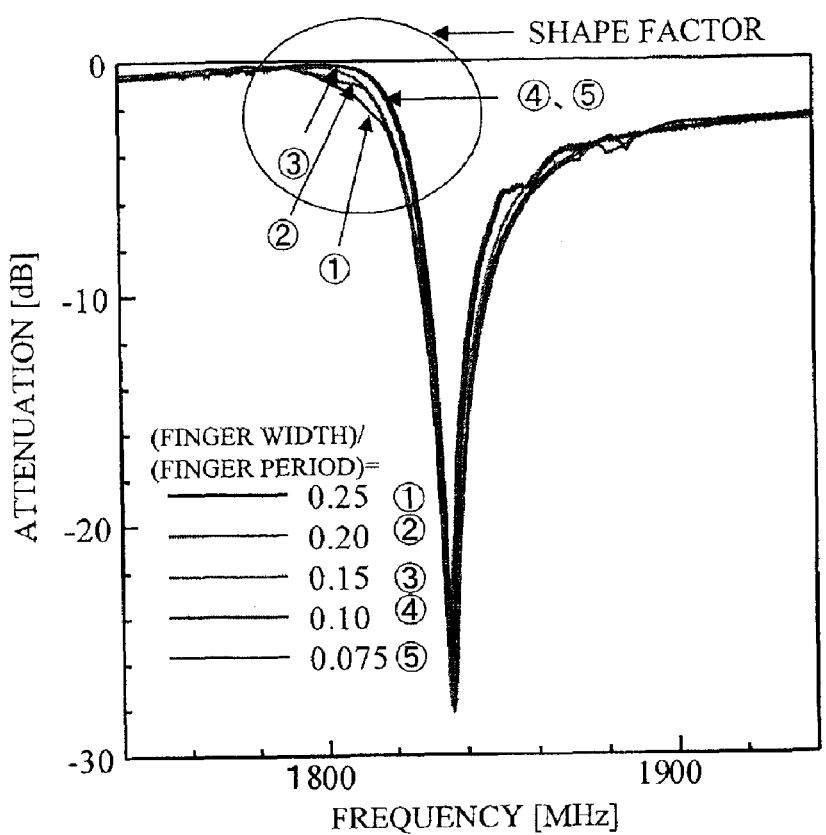
FIG. 9 is a graph showing changes of the pass band developed when the value of (electrode finger width)/(electrode finger period) is changed.

The inventors prepared a series-arm resonator shown in FIG. 8 and investigated variation in the pass band characteristic by changing the value (electrode finger width)/(electrode finger period). The sharpness of the transient section on the high-frequency side of the ladder-type SAW filter is defined by the characteristics of the series-arm resonators. Therefore, as the transient sections of the series-arm resonators become sharper, the shape factor of the SAW filter is improved. FIG. 9 shows our experimental results in which variation in the pass band responsive to change in the ratio (electrode finger width)/(electrode finger period) is depicted therein. The other design parameters used are shown in Table 2.

TABLE 2

| Electrode Finger Period [μm] | Electrode Finger Crossing Width [μm] | Number of Finger Pairs | Reflector Finger Period [μm] | Number of Fingers of Reflector |
|---|---|---|---|---|
| 2.1 | 30 | 160 | 1.05 | 120 |

It can be seen from FIG. 9 that the high-frequency end portion of the pass band is raised so that the transient section becomes sharper by setting the ratio of (electrode finger width)/(electrode finger period) smaller than 0.25. It has been confirmed that the shape factor can be improved as well by decreasing the ratio of (electrode finger width)/(electrode finger period) down to 0.075. However, improvement in the shape factor could not be confirmed when the ratio of (electrode finger width)/(electrode finger period) is lower than 0.075. It is therefore found that the shape factor of the SAW filter can be improved in such a way that the ratio (electrode finger width)/(electrode finger period) in the interdigital transducer of at least one of the series-arm resonators in the ladder-type SAW filter is smaller than 0.25 (25%) and equal to or larger than 0.075 (7.5%).

The inventors prepared a ladder-type SAW filter that has the construction shown in FIGS. 1A and 1B, in which the ratio of (electrode finger width)/(electrode finger period) in the interdigital transducer of each of the series-arm resonators is equal to 0.175. The other parameter values employed are shown in Table 3.

Figure 10:
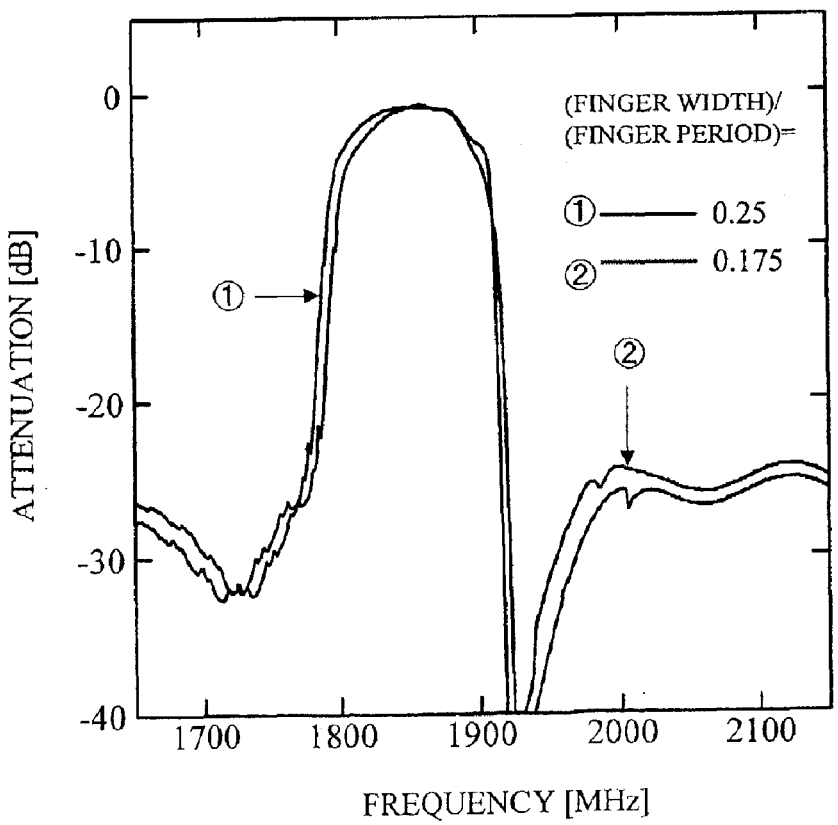
FIG. 10 is a graph of a pass band characteristic obtained when the value (electrode finger width)/(electrode finger period) is set at 0.175.

FIG. 10 illustrates the frequency characteristic of the above-mentioned SAW filter in Table 3 and that of a comparative SAW filter that has the parameter values shown in Table 1 and a ratio (electrode finger width)/(electrode finger period) of 0.25. Although the reason why the shape factor can be improved by setting the ratio (electrode finger width)/(electrode finger period) smaller than 0.25 is not figured out completely, the phenomenal fact shows that high-frequency end portion of the pass band is actually raised by the above setting.

Figure 11:
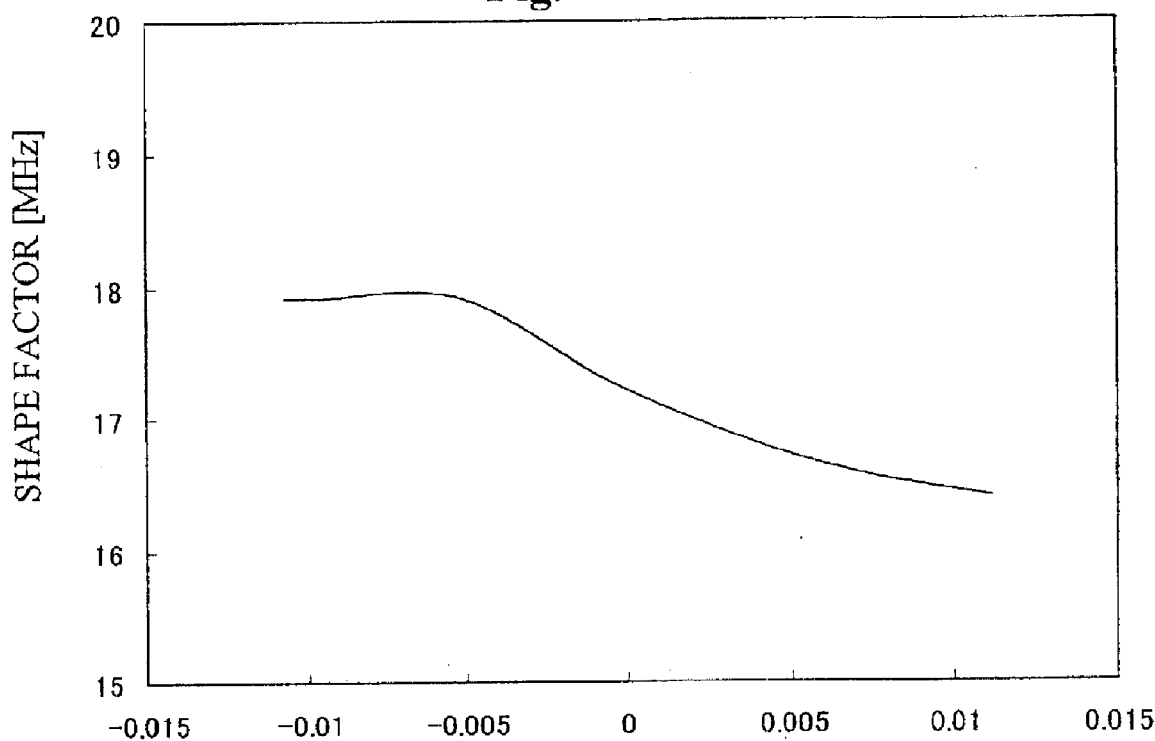
FIG. 11 is a graph showing variation in the shape factor observed when the electrode finger period of the series-arm resonator S1 of the first stage is changed.
Figure 12:
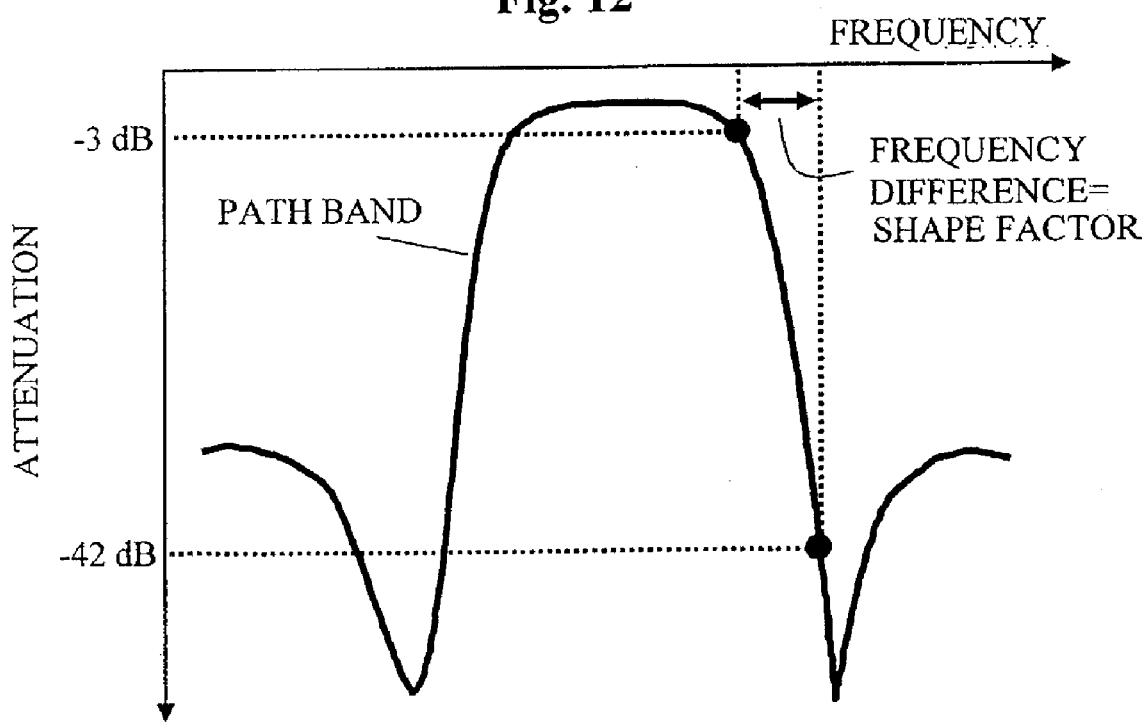
FIG. 12 is a graph showing definition of the shape factor.

A description will now be given of variation in the shape factor observed when the means for improving the breakdown power according to the first or second aspect of the present invention is applied to the above-mentioned ladder-type SAW filter having the raised high-frequency end portion of the pass band. SAW filters were prepared by changing, to different values, the finger electrode period of only the series-arm resonator S1 of the first stage having the parameter values shown in Table 3. Then, the shape factors of these SAW filters were validated. The results of this validation are shown in FIG. 11. In the validation, the shape factor is defined as the difference between the frequency for an attenuation of −3 dB in the transient section on the high-frequency side and the frequency for an attenuation of −42 dB in the same transient section as described above, as shown in FIG. 12. It can be seen from FIG. 11 that the shape factor can be improved by increasing the electrode finger period of the series-arm resonator of the first stage. It is therefore found that both the breakdown power and the shape factor can be, simultaneously improved by increasing the electrode finger period of the first-stage series-arm resonator.

Figure 13:
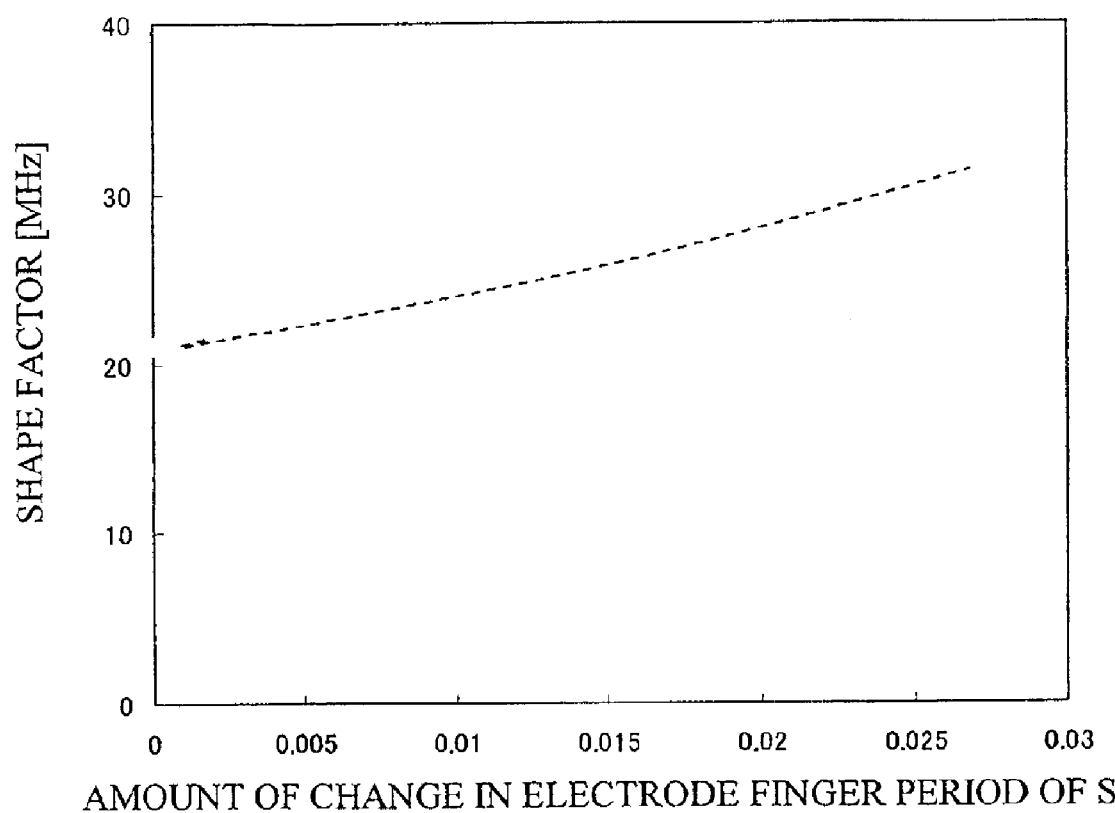
FIG. 13 is a graph showing variation in the shape factor as a function of change in the electrode finger period of the series-arm resonator S1 of the first stage observed when the ratio (electrode finger width)/(electrode finger period) is equal to 0.25.

Also, for the purpose of comparison, FIG. 13 shows variation in the shape factor observed by changing the electrode finger period of the series-arm resonator S1 of the first stage of the SAW filter having a ratio (electrode finger width)/(electrode finger period) of 0.25. The shape factor gradually degrades as the electrode finger period increases. It can be seen from the above-mentioned results that simultaneous improvements in the shape factor and breakdown power resulting from increase in the electrode finger period of the series-arm resonator S1 of the first stage are peculiar to the SAW filters in which the ratio (electrode finger width)/(electrode finger period) in any of the series-arm resonators is smaller than 0.25. Even when only one of the series-arm resonator has a ratio (electrode finger width)/(electrode finger period) smaller than 0.25, simultaneous improvements in both the shape factor and the breakdown power can be achieved. This is because the raised high-frequency end portion of the pass band can be obtained even when only one of the series-arm resonators has a ratio (electrode finger width)/(electrode finger period) lower than 0.25.

TABLE 3

| | | Electrode Finger Period [μm] | Electrode Finger Crossing Width [μm] | Number of Finger Pairs | Electrode Finger Width/ Electrode Finger Period | Reflector Finger Period [μm] | Number of Fingers of Reflector |
|---|---|---|---|---|---|---|---|
| Series Arm | S1 | 2.12 | 50 | 160 | 0.25 | 1.06 | 120 |
| | S2 | 2.12 | 50 | 160 | 0.25 | 1.06 | 120 |
| | S3 | 2.12 | 50 | 160 | 0.25 | 1.06 | 120 |
| | S4 | 2.12 | 50 | 120 | 0.25 | 1.06 | 120 |
| Parallel Arm | P1 | 2.16 | 60 | 90 | 0.25 | 1.08 | 120 |
| | P2 | 2.16 | 60 | 90 | 0.25 | 1.08 | 120 |

It is to be noted that the raising of the high-frequency end portion of the pass band becomes more conspicuous when the ratio (electrode finger width)/(electrode finger period) is equal to or smaller than 0.225 from FIG. 9. The lower limit of the ratio (electrode finger width)/(electrode finger period) is preferably equal to or larger than 0.075 due to the result that the fact that the excitation efficiency is greatly degraded if the electrode finger width is too narrow.

A more preferable range of the electrode finger width is described. Generally, the productivity is low and the yield is not good when the electrode finger width is narrow. This is described in detail with the following example. A cellular phone employs an antenna duplexer having a pass band in the vicinity of 2 GHz. The interdigital transducers of the duplexer have an electrode finger period of about 2 μm. When an i-line stepper is less expensive is used to form the electrode finger pattern with an appropriate yield, the lower limit of the electrode finger width is approximately equal to 0.3 μm. Thus, it is preferable that the lower limit of the ratio (electrode finger width)/(electrode finger period) is set equal to 0.15 in terms of productivity. When the ratio (electrode finger width)/(electrode finger period) ranges from 0.15 (15%) to 0.225 (22.5%), it is possible to simultaneously improve both the shape factor and the breakdown power while securing productivity.

As described above, both the shape factor and the breakdown power can be simultaneously improved by setting the ratio in the above range in any of the series-arm resonators having the raised high-frequency end portion of the pass band.

(Fourth Embodiment)

A fourth embodiment of the present invention corresponds to the aforementioned sixth aspect of the invention directed to raising the high-frequency end portion of the pass band.

Figure 14:
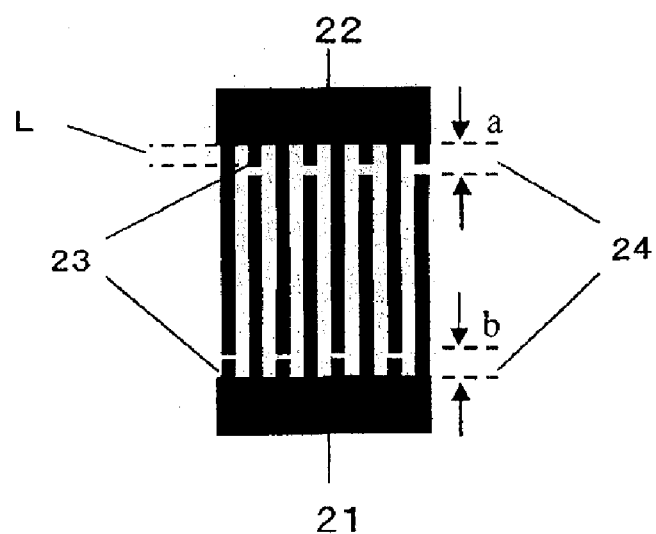
FIG. 14 shows the length of finger non-overlapping (non-crossing) portions of the interdigital transducer.

In order to raise the high-frequency end portion of the pass band, the sixth aspect of the invention sets the length of non-crossing or non-overlapping portions of the electrode fingers that form the interdigital transducer in any of the series-arm resonators to 1.0–4.5 times the electrode finger period, and arranges dummy electrodes in the non-overlapping portions. The inventors prepared SAW filters that have the construction of the ladder-type SAW filter shown in FIG. 1A by changing the length of the finger non-overlapping portions in the series-arm resonators. Then, the pass band characteristics of these SAW filters were validated. It should be noted that the length of the finger non-overlapping portions of the interdigital transducer is defined as a+b shown in FIG. 14. The length a corresponds to the distance between the end of each finger of a first comb-type electrode 21 and a rectangular base portion (bus bar) of a second comb-type electrode 22. Similarly, the length b corresponds to the distance between the end of each finger of the second comb-type electrode 22 and the rectangular base portion (bus bar) of the first comb-type electrode 21. Hereinafter, the finger non-overlapping portions are indicated by a reference numeral 24.

In the inventors' experiment, the length a+b of the finger non-overlapping portions 24 was set equal to 2.5 times the electrode finger period. Further, the finger non-overlapping portions 24 were provided with dummy electrodes 23 that have a length equal to the electrode finger period. The dummy electrodes 23 extend from the base portions of the comb-type electrodes 21 and 22 towards the ends of the corresponding fingers, and are not involved in excitation of SAW.

Figure 15:
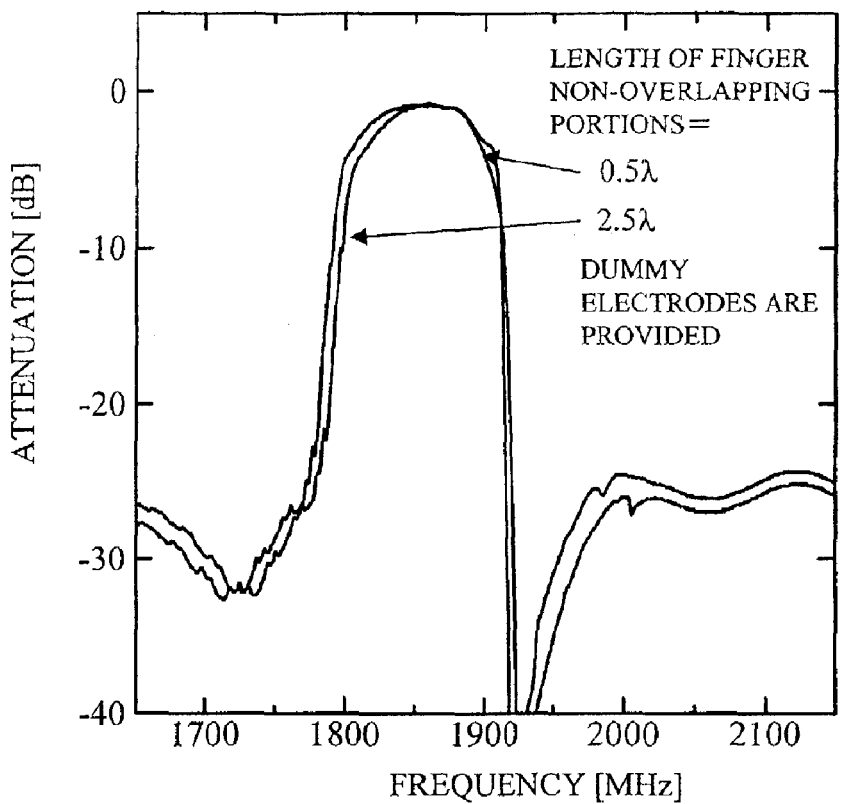
FIG. 15 is a graph of variation in the pass band observed when the length of the finger non-overlapping portions of the interdigital transducer of the series-arm resonator is changed in which dummy electrodes are arranged therein.
Figure 16:
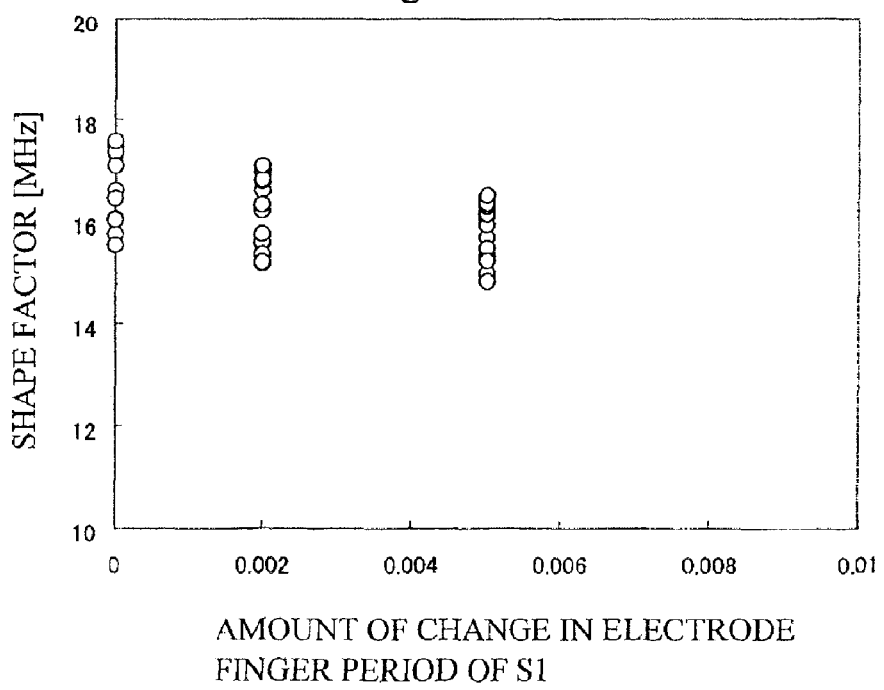
FIG. 16 shows variation in the shape factor observed when the electrode finger period of the series-arm resonator S1 of the first stage under the condition that the length of the finger non-overlapping portions is equal to 2.5 times the electrode finger period.

FIG. 15 shows pass bands of the SAW filters that employ the above-mentioned respective interdigital transducers. It can be seen from FIG. 15 that the high-frequency end portion of the pass band is raised by lengthening the finger non-overlapping portions 24 from 0.5 times the electrode finger period to 2.5 times and arranging the dummy electrodes 23. FIG. 16 shows results of validating variation in the shape factor by changing the electrode finger period of the series-arm resonator S1 of the first stage of the ladder-type SAW filter in which the length of the finger non-overlapping portions is set equal to 2.5 times the electrode finger period. In this case, the shape factor is defined as the difference between the frequency for an attenuation of −3 dB in the transient section on the high-frequency side and the frequency for an attenuation of −42 dB in the same transient section. It can be seen from FIG. 16 that the shape factor of the pass band is improved by lengthening the electrode finger period of the series-arm resonator S1 of the first stage. When the SAW filter having the raised high-frequency end portion of the pass band is used, both the shape factor and the breakdown power can be simultaneously improved by lengthening the electrode finger period of the series-arm S1 of the first stage.

Figure 18:
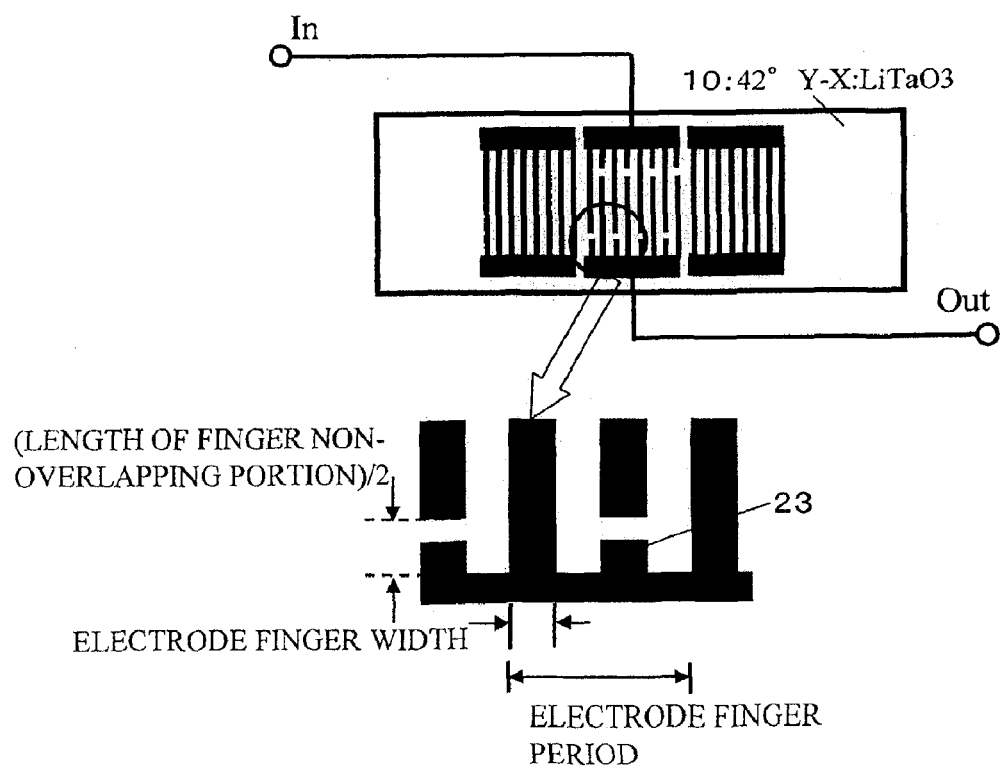
FIG. 18 shows the structure of a series-arm resonator used to validate the shape factor.
Figure 19:
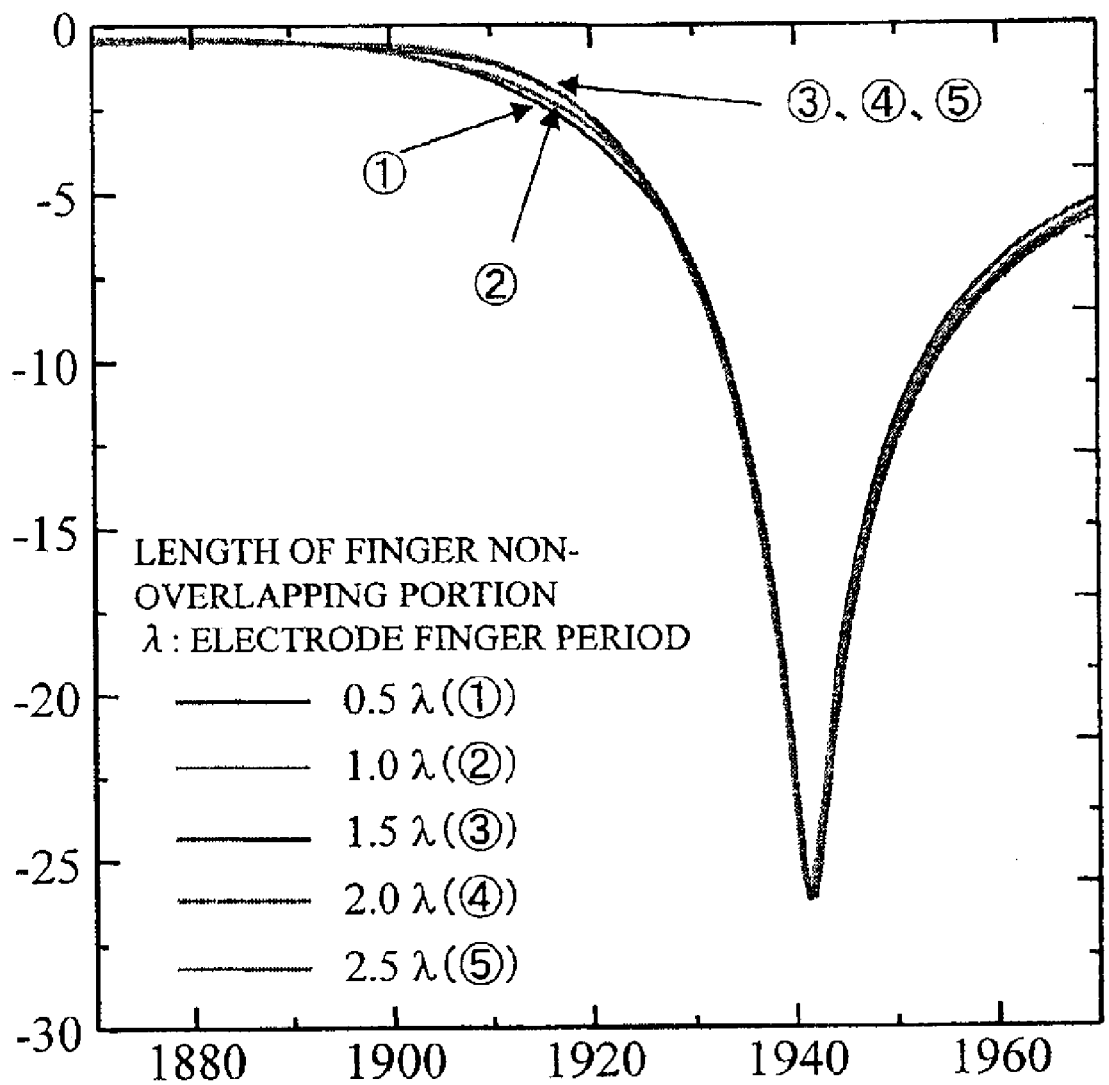
FIG. 19 shows variation in the pass band observed when the length of the finger non-overlapping portions is changed.

The possible range of the length of the finger non-overlapping portions 24 is now described. The inventors prepared SAW filters that have a structure shown in FIG. 18 and changed the length of the finger non-overlapping portions 24. Then, the pass band characteristics of these SAW filters were validated. The dummy electrodes 23 that are not involved in excitation of SAW were provided in the finger non-overlapping portions. The results of validation are shown in FIG. 19. It can be seen that the high-frequency end portion of the pass band of the SAW filter having the length of the finger non-overlapping portions 24 equal to 1.0 times the electrode finger period is raised much more than that of the pass band of the SAW filter having the length of the non-overlapping portions 24 equal to 0.5 times the electrode finger period. Also, there is no substantial improvement in the pass band characteristic when the length of the finger non-overlapping portions 24 is 1.5 times the electrode finger period or more. It is preferable that the upper limit of the length of the finger non-overlapping portions 24 is 4.5 times the electrode finger period. This is because, if the length of the finger non-overlapping portions 24 is to long over 4.5 times, the efficiency of SAW excitation will be degraded and the insertion loss will be increased. Further, an increased area occupied by the interdigital transducer on the chip will be needed, which will prevent downsizing of the SAW filter.

FIRST EXAMPLE

The first example of the SAW filter of the present invention employs a LiTaO$_3$ 42° Y-cut X-propagation substrate on which the four series-arm resonators S1–S4 and two parallel-arm resonators P1 and P2 are arranged in the ladder formation as shown in FIGS. 1A and 1B. The pass band of the SAW filter is in the 1.9 GHz band. The electrode finger periods $\lambda_{S2}$, $\lambda_{S3}$ and $\lambda_{S4}$ of the series-arm resonators S2, S3 and S4 are equal to 2.09 μm ($\lambda_{S2}=\lambda_{S3}=\lambda_{S4}=2.09$ μm). The electrode finger periods $\lambda_{P1}$ and $\lambda_{P2}$ of the parallel-arm resonators P1 and P2 are equal to 2.16 μm ($\lambda_{P1}=\lambda_{P2}=2.16$ μm). The series-arm resonator S1 has an electrode finger period $\lambda_{S1}$ of 2.09 μm (sample A), 2.095 μm (sample B) and 2.100 μm (sample C). In samples A, B and C, the change ratios of the electrode finger period $\lambda_{S1}$ of the series-arm resonator S1 to the average of the electrode finger periods of the series-arm resonators S2, S3 and S4 are respectively 0%, 0.24% and 0.48%. The ratios (electrode finger width)/(electrode finger period) of samples A, B and C are all equal to 0.25. The aperture lengths of all the series-arm resonators S1–S4 in samples A, B and C are 35 μm and the numbers of pairs of fingers are 150. The electrodes are made of Al-0.5 wt % Cu (150 nm)/Ti (20 nm). In order to validate the breakdown power of the samples, power is applied to the high-frequency end of the −3 dB pass band at an environmental temperature of 85° C. The breakdown power is defined as power applied just before the characteristics are degraded by raising power by 0.1 W every five minutes starting from an initial power of 0.8 W. The threshold for determining characteristic degradation is an event in which the −3 dB pass bandwidth is decreased to 95% of the initial bandwidth or lower. The validation results show samples A, B and C have breakdown powers of 1.0 W, 1.2 W and 1.4 W. It follows that the breakdown power can be enhanced by lengthening the electrode finger period $\lambda_{S1}$ of the series-arm resonator S1 of the first stage.

SECOND EXAMPLE

The second example of the SAW filter of the present invention employs a LiTaO$_3$ 42° Y-cut X-propagation substrate on which the four series-arm resonators S1–S4 and two parallel-arm resonators P1 and P2 are arranged in the ladder formation as shown in FIGS. 1A and 1B. The pass band of the SAW filter is in the 1.9 GHz band. The ratios (electrode finger width)/(electrode finger period) of all the series-arm resonators S1–S4 are equal to 0.175. The ratios (electrode finger width)/(electrode finger period) of all the parallel-arm resonators P1 and P2 are equal to 0.25. The electrode finger periods $\lambda_{S2}$, $\lambda_{S3}$ and $\lambda_{S4}$ of the series-arm resonators S2, S3 and S4 are equal to 2.12 μm ($\lambda_{S2}=\lambda_{S3}=\lambda_{S4}=2.12$ μm). The electrode finger periods $\lambda_{P1}$ and $\lambda_{P2}$ of the parallel-arm resonators P1 and P2 are equal to 2.16 μm ($\lambda_{P1}=\lambda_{P2}=2.16$ μm). The series-arm resonator S1 has an electrode finger period $\lambda_{S1}$ of 2.12 μm (sample D), 2.125 μM (sample E) and 2.13 μm (sample F). In samples E, F and G, the change ratios of the electrode finger period $\lambda_{S1}$ of the series-arm resonator S1 to the average of the electrode finger periods of the series-arm resonators S2, S3 and S4 are respectively 0%, 0.24% and 0.47%. The aperture lengths of all the series-arm resonators S1–S4 are 50 μm and the numbers of pairs of fingers are 150. The electrodes are made of Al-1 wt % Cu (130 nm)/Ti (40 nm). In order to validate the breakdown power of the samples, power is applied to the high-frequency end of the −3 dB pass band at an environmental temperature of 85° C. The breakdown power is defined as power applied just before the characteristics are degraded by raising power by 0.1 W every five minutes starting from an initial power of 0.8 W. The threshold for determining characteristic degradation is an event in which the −3 dB pass bandwidth is decreased to 95% of the initial bandwidth or lower. The validation results show samples D, E and F have breakdown powers of 1.1 W, 1.8 W and 2.0 W. It follows that the breakdown power can be enhanced by lengthening the electrode finger period $\lambda_{S1}$ of the series-arm resonator S1 of the first stage. Further, the shape factors of the three samples (the difference between the frequency for −3 dB in the high-frequency transient section and the frequency for −42 dB therein) are respectively 17.2 MHz, 16.8 MHz and 16.5 MHz. This shows that the shape factor can be improved by lengthening the electrode finger period $\lambda_{S1}$ of the series-arm resonator S1 of the first stage. As a result, both the breakdown power and the shape factor can be improved by lengthening the electrode finger period $\lambda_{S1}$ of the series-arm resonator S1 of the first stage.

THIRD EXAMPLE

The third example of the SAW filter of the present invention employs a LiTaO$_3$ 42° Y-cut X-propagation substrate on which the four series-arm resonators S1–S4 and two parallel-arm resonators P1 and P2 are arranged in the ladder formation as shown in FIGS. 1A and 1B. The pass band of the SAW filter is in the 1.9 GHz band. The ratios (electrode finger width)/(electrode finger period) of all the series-arm resonators S1–S4 are equal to 0.20. The ratios (electrode finger width)/(electrode finger period) of all the parallel-arm resonators P1 and P2 are equal to 0.25. The finger non-overlapping portions of all the series-arm resonators S1–S4 are set equal to 2.5 times the electrode finger period. The dummy electrodes 23 (FIG. 14) having the same length as the electrode finger period are arranged in the finger non-overlapping portions. The electrode finger periods $\lambda_{S2}$, $\lambda_{S3}$ and $\lambda_{S4}$ of the series-arm resonators S2, S3 and S4 are equal to 2.12 μm ($\lambda_{S2}=\lambda_{S3}=\lambda_{S4}=2.12$ μm). The electrode finger periods $\lambda_{P1}$ and $\lambda_{P2}$ of the parallel-arm resonators P1 and P2 are equal to 2.16 μm ($\lambda_{P1}=\lambda_{P2}=2.16$ μm). The series-arm resonator S1 has an electrode finger period $\lambda_{S1}$ of 2.12 μm (sample G), 2.122 μm (sample H) and 2.125 μm (sample I). In samples G, H and I, the change ratios of the electrode finger period $\lambda_{S1}$ of the series-arm resonator S1 to the average of the electrode finger periods of the series-arm resonators S2, S3 and S4 are respectively 0%, 0.094% and 0.24%. The aperture lengths of all the series-arm resonators S1–S4 are 40 μm and the numbers of pairs of fingers are 150. The electrodes are made of Al-0.5 wt % Cu (130 nm)/Ti (40 nm). In order to validate the breakdown power of the samples, power is applied to the high-frequency end of the −3 dB pass band at an environmental temperature of 85° C. The breakdown power is defined as power applied just before the characteristics are degraded by raising power by 0.1 W every five minutes starting from an initial power of 0.8 W. The threshold for determining characteristic degradation is an event in which the −3 dB pass bandwidth is decreased to 95% of the initial bandwidth or lower. The validation results show samples G, H and I have breakdown powers of 1.1 W, 1.4 W and 1.8 W. It follows that the breakdown power can be enhanced by lengthening the electrode finger period $\lambda_{S1}$ of the series-arm resonator S1 of the first stage. Further, the shape factors of the three samples (the difference between the frequency for −3 dB in the high-frequency transient section and the frequency for −42 dB therein) are respectively 16.1 MHz, 15.6 MHz and 15.3 MHz. This shows that the shape factor can be improved by lengthening the electrode finger period $\lambda_{S1}$ of the series-arm resonator S1 of the first stage. As a result, both the breakdown power and the shape factor can be improved by lengthening the electrode finger period $\lambda_{S1}$ of the series-arm resonator S1 of the first stage.

EXAMPLE 4

Figure 17:
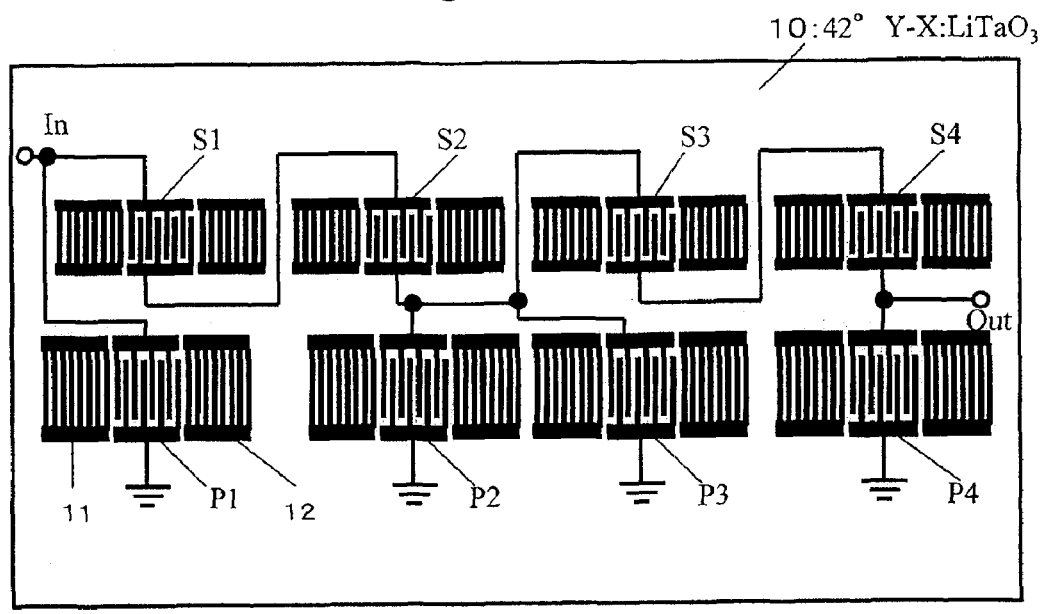
FIG. 17 shows the structure of a SAW filter used in a fourth example.

The fourth example of the SAW filter of the present invention employs a LiTaO$_3$ 42° Y-cut X-propagation substrate on which the four series-arm resonators S1–S4 and four parallel-arm resonators P1–P4 are arranged in the ladder formation as shown in FIG. 17. The pass band of the SAW filter is in the 1.9 GHz band. The ratios (electrode finger width)/(electrode finger period) of all the series-arm resonators S1–S4 are equal to 0.25. The ratios (electrode finger width)/(electrode finger period) of all the parallel-arm resonators P1–P4 are equal to 0.25. The electrode finger periods $\lambda_{S1}$, $\lambda_{S2}$, $\lambda_{S3}$ and $\lambda_{S4}$ of the series-arm resonators S1–S4 are equal to 2.04 μm ($\lambda_{S1}=\lambda_{S2}=\lambda_{S3}=\lambda_{S4}=2.04$ μm). The electrode finger periods $\lambda_{P2}$, $\lambda_{P3}$, $\lambda_{P4}$ of the parallel-arm resonators P2–P4 are equal to 2.04 μm ($\lambda_{P2}=\lambda_{P3}=\lambda_{P4}=2.04$ μm). The parallel-arm resonator P1 has an electrode finger period $\lambda_{P1}$ of 2.04 μm (sample J), 2.035 μm (sample K) and 2.03 μm (sample L). In samples J, K and L, the change ratios of the electrode finger period $\lambda_{P1}$ of the parallel-arm resonator P1 to the average of the electrode finger periods of the parallel-arm resonators P2, P3 and P4 are respectively 0%, 0.25% and 0.49%. The aperture lengths of all the series-arm resonators S1–S4 are 30 μm and the numbers of pairs of fingers are 130. The aperture lengths of all the parallel-arm resonators P1–P4 are 40 μm and the numbers of pairs of fingers are 60. The electrodes are made of Al-0.5 wt % Cu (150 nm)/Ti (20 nm). In order to validate the breakdown power of the samples, power is applied to the high-frequency end (about 1930 MHz) of the −3 dB pass band at an environmental temperature of 85° C. The breakdown power is defined as power applied just before the characteristics are degraded by raising power by 0.1 W every five minutes starting from an initial power of 0.8 W. The threshold for determining characteristic degradation is an event in which the −3 dB pass bandwidth is decreased to 95% of the initial bandwidth or lower. The validation results show samples J, K and L have breakdown powers of 1.2 W, 1.4 W and 1.6 W. It follows that the breakdown power can be enhanced by decreasing the electrode finger period $\lambda_{P1}$ of the parallel-arm resonator P1 of the first stage.

(Fifth Embodiment)

An application of the above-mentioned SAW filter will now be described as a fifth embodiment of the present invention.

Figure 20:
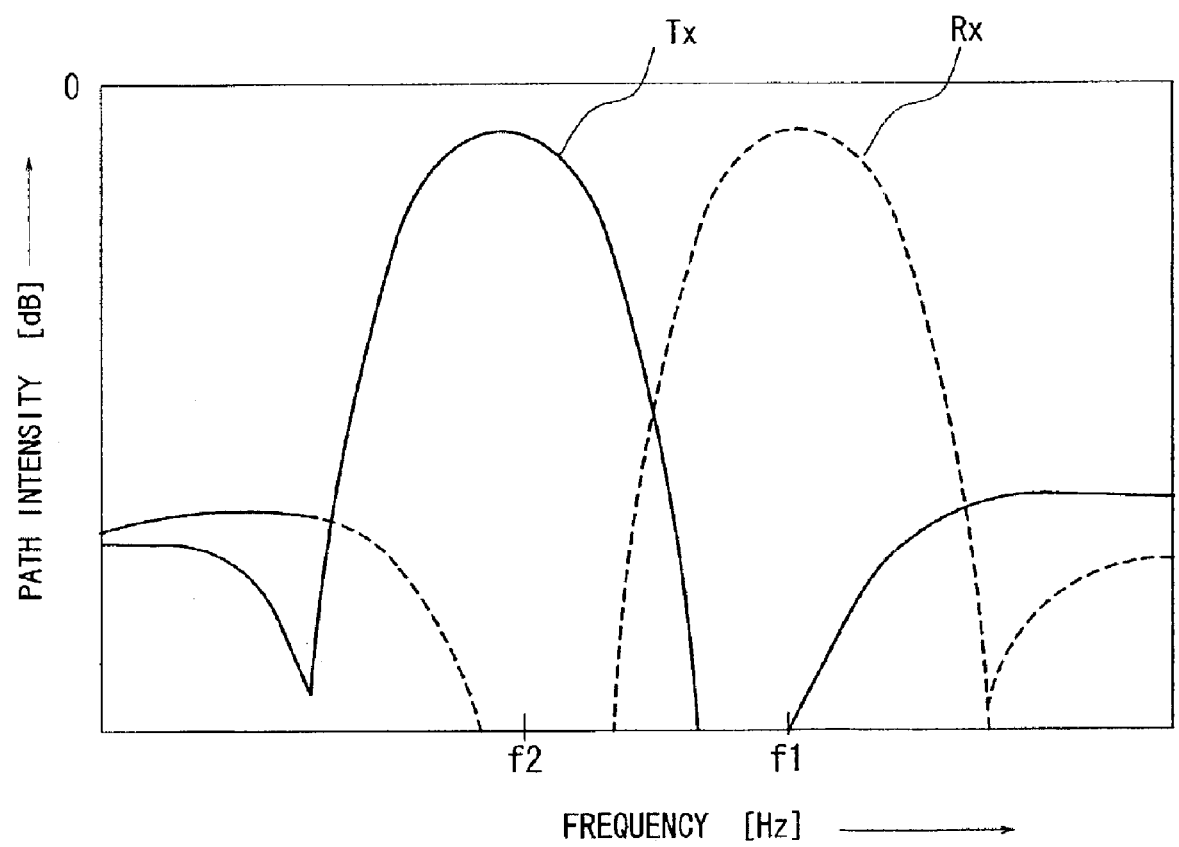
FIG. 20 is a block diagram of a duplexer according to an aspect of the invention.

FIG. 20 is a block diagram of a duplexer with the SAW filter of the present invention. The duplexer shown in FIG. 20 is an antenna duplexer, which is connected to an antenna part via common input terminals T0. The antenna duplexer has a receive filter Rx (F1) and a transmit filter Tx (F2), which are connected to the antenna part via the common input terminals T0. The transmit filter Tx is needed to have a higher breakdown power than the receive filter Rx, and is therefore implemented by the above-mentioned SAW filter of the present invention. Of course, the receive filter Rx may be formed by the SAW filter of the present invention. For example, when a possibility of leakage power from the transmit filter Tx applied to the low-frequency-side suppression range of the receive filter Rx should be considered, the receive filter Rx will preferably be formed by the SAW filter of the invention with improved breakdown power.

Figure 21:
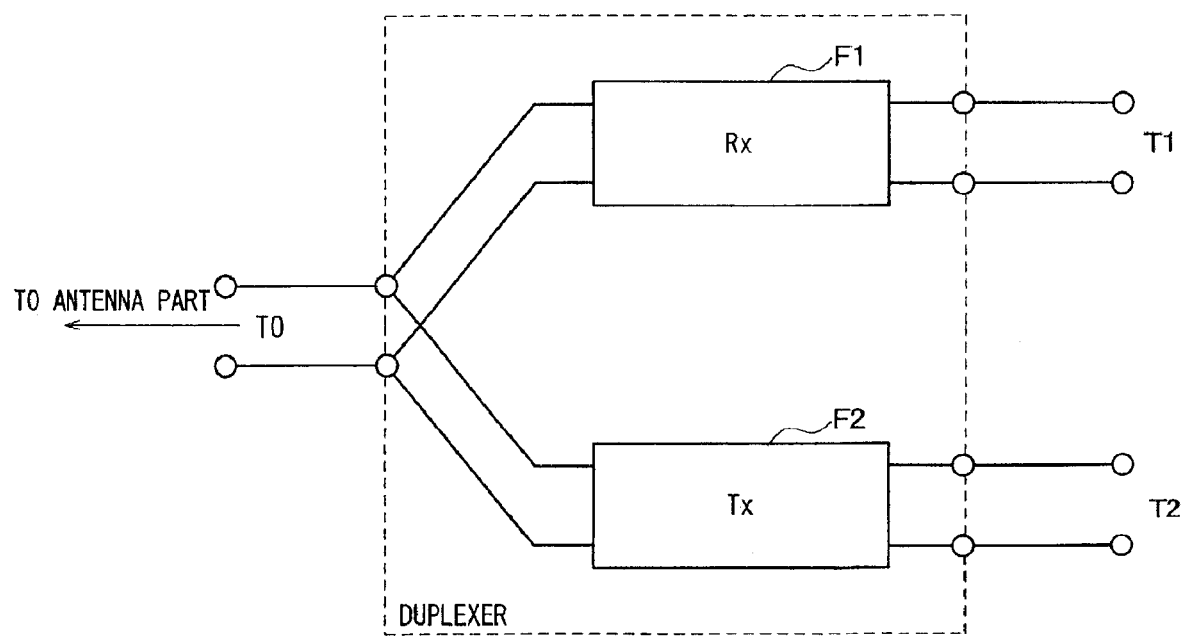
FIG. 21 is a graph schematically illustrating the frequency characteristic of the duplexer.

FIG. 21 schematically illustrates a frequency characteristic of the duplexer shown in FIG. 20. The pass band of the receive filter Rx (which has a center frequency f1) is located at a high-frequency side, as compared to the pass band of the transmit filter Tx (which as a center frequency f2 (<f1)). It is to be noted that FIG. 21 merely shows the frequency relationship between the receive filter Rx and the transmit filter Tx of the antenna duplexer and that the actual pass band characteristics thereof are as has been described previously.

The antenna duplexer shown in FIG. 20 may be varied so that a characteristic impedance matching circuit may be placed between the antenna part and one of the filters Tx and Rx or between the antenna part and both the filters Tx and Rx.

According to the fifth embodiment of the present invention, it is possible to provide the antenna duplexer with the improved breakdown power. When the SAW filter according to the third or fourth embodiment of the present invention is employed, antenna duplexers and filters that have both the excellent breakdown power and the excellent shape factor can be provided. These antenna duplexers and filters can be used for applications that have a pass band higher than 1 GHz and located in the 1.8–2 GHz band and need a filter pass band characteristic with an improved shape factor.

The transmit filter Tx and the receive filter Rx may be formed on separate chips (made of piezoelectric substance), or may be formed on a single chip.

The present invention is not limited to the specifically disclosed embodiments, but other embodiments and variations may be made without departing from the scope of the present invention. For example, the number of series-arm resonators and the number of parallel-arm resonators in the ladder formation are not limited to the figures mentioned before, but an arbitrary number of series-arm resonators and an arbitrary number of parallel-arm resonators may be employed. It is also possible to employ an arbitrary number of stages. The SAW element of the invention is not limited to the aforementioned LiTaO$_3$ Y-cut X-propagation substrate but may employ another piezoelectric element such as LiNbO$_3$, Li$_4$B$_2$O$_7$ and PZT, on which the interdigital transducers are formed.

According to the present invention, there are provided the SAW element with the breakdown power being improved, the SAW element with both the breakdown power and the shape factor being improved, the transmit filter and the duplexer using any of these SAW elements. Particularly, it is possible to provide highly reliable filters and duplexers having a pass band over 1 GHz by using the SAW element of the invention.

What is claimed is:

1. A surface acoustic wave element comprising surface acoustic wave (SAW) resonators arranged in a ladder formation on a piezoelectric substrate, a resonance frequency $f_{S1}$ of a series-arm resonator of a first stage viewed from an input side of the surface acoustic wave element and an average resonance frequency $f_{Sav}$ of all of remaining series-arm SAW resonators satisfying $1.00f_{Sav} > f_{S1} \geq 0.99f_{Sav}$, wherein the interdigital transducer of at least one of the series-arm resonators has an electrode finger width that is equal to or larger than 7.5% of the electrode finger period of said at least one of the series-arm resonators and is smaller than 25% thereof.

2. A surface acoustic wave element comprising surface acoustic wave (SAW) resonators arranged in a ladder formation on a piezoelectric substrate, a resonance frequency $f_{S1}$ of a series-arm resonator of a first stage viewed from an input side of the surface acoustic wave element and an average resonance frequency $f_{Sav}$ of all of remaining series-arm SAW resonators satisfying $1.00f_{Sav} > f_{S1} \geq 0.99f_{Sav}$, wherein the interdigital transducer of at least one of the series-arm resonators has an electrode finger width that is equal to or larger than 15% of the electrode finger period of said at least one of the series-arm resonators and is smaller than 22.5% thereof.

3. A surface acoustic wave element comprising surface acoustic wave (SAW) resonators arranged in a ladder formation on a piezoelectric substrate, a resonance frequency $f_{S1}$ of a series-arm resonator of a first stage viewed from an input side of the surface acoustic wave element and an average resonance frequency $f_{Sav}$ of all of remaining series-arm SAW resonators satisfying $1.00f_{Sav} > f_{S1} \geq 0.99f_{Sav}$, wherein the interdigital transducer of at least one of the series-arm resonators has finger non-overlapping portions having a length equal to 1.0–4.5 times the electrode finger period, and dummy electrodes that are not involved in excitation of SAW are provided in the non-overlapping portions.

4. The surface acoustic wave element according to any one of claims 1, 2, and 3, wherein the surface acoustic wave element is a transmit filter.

5. The surface acoustic wave element according to any one of claims 1, 2, and 3, wherein the surface acoustic wave element is a transmit filter provided in a duplexer.

6. A surface acoustic wave element comprising surface acoustic wave (SAW) resonators arranged in a ladder formation on a piezoelectric substrate, ratios (electrode finger width)/(Electrode finger period) in interdigital transducers of series-arm resonators are substantially equal to each other, a resonance finger period $\lambda_{S1}$ of the series-arm resonator of a first stage viewed from an input side of the surface acoustic wave element and an average electrode finger period $\lambda_{Sav}$ of all the remaining series-arm SAW resonators satisfying $1.01\lambda_{Sav} \geq \lambda_{S1} > 1.00\lambda_{Sav}$, wherein the interdigital transducer of at least one of the series-arm resonators has an electrode finger width that is equal to or larger than 7.5% of the electrode finger period of said at least one of the series-arm resonators and is smaller than 25% thereof.

7. A surface acoustic wave element comprising surface acoustic wave (SAW) resonators arranged in a ladder formation on a piezoelectric substrate, ratios (electrode finger width)/(Electrode finger period) in interdigital transducers of series-arm resonators are substantially equal to each other, a resonance finger period $\lambda_{S1}$ of the series-arm resonator of a first stage viewed from an input side of the surface acoustic wave element and an average electrode finger period $\lambda_{Sav}$ of all the remaining series-arm SAW resonators satisfying $1.01\lambda_{Sav} \geq \lambda_{S1} > 1.00\lambda_{Sav}$, wherein the interdigital transducer of at least one of the series-arm resonators has an electrode finger width that is equal to or larger than 15% of the electrode finger period of said at least one of the series-arm resonators and is smaller than 22.5% thereof.

8. A surface acoustic wave element comprising surface acoustic wave (SAW) resonators arranged in a ladder formation on a piezoelectric substrate, ratios (electrode finger width)/(Electrode finger period) in interdigital transducers of series-arm resonators are substantially equal to each other, a resonance finger period $\lambda_{S1}$ of the series-arm resonator of a first stage viewed from an input side of the surface acoustic wave element and an average electrode finger period $\lambda_{Sav}$ of all the remaining series-arm SAW resonators satisfying $1.01\lambda_{Sav} \geq \lambda_{S1} > 1.00\lambda_{Sav}$, wherein the interdigital transducer of at least one of the series-arm resonators has finger non-overlapping portions having a length equal to 1.0–4.5 times the electrode finger period, and dummy electrodes that are not involved in excitation of SAW are provided in the non-overlapping portions.

9. The surface acoustic wave element according to any one of claims 6, 7, and 8, wherein the surface acoustic wave element is a transmit filter.

10. The surface acoustic wave element according to any one of claims 6, 7, and 8, wherein the surface acoustic wave element is a transmit filter provided in a duplexer.

* * * * *